United States Patent
Park et al.

(10) Patent No.: US 12,300,160 B2
(45) Date of Patent: May 13, 2025

(54) DISPLAY PANEL

(71) Applicant: Samsung Display Co., Ltd., Yongin-si (KR)

(72) Inventors: Heejean Park, Yongin-si (KR); Hyeongseok Kim, Yongin-si (KR); Junhyun Park, Yongin-si (KR); Sunhwa Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/622,488

(22) Filed: Mar. 29, 2024

(65) Prior Publication Data

US 2024/0363056 A1    Oct. 31, 2024

(30) Foreign Application Priority Data

Apr. 27, 2023  (KR) .................. 10-2023-0055599

(51) Int. Cl.
*G09G 3/32* (2016.01)
*H01L 27/12* (2006.01)

(52) U.S. Cl.
CPC ............. *G09G 3/32* (2013.01); *H01L 27/124* (2013.01); *G09G 2300/0426* (2013.01); *G09G 2310/0267* (2013.01); *G09G 2310/08* (2013.01)

(58) Field of Classification Search
CPC ............ G09G 3/32; G09G 2300/0426; G09G 2310/0267; G09G 2310/08; G09G 3/3233; G09G 2300/0413; G09G 2300/0465; G09G 2300/0842; G09G 2320/0233; G09G 2330/08; G09G 2340/0435; H01L 27/124; H10K 59/1216; H10K 59/124; H10K 59/131; G06F 3/04164; G06F 1/16;
(Continued)

(56) References Cited

U.S. PATENT DOCUMENTS 9,466,652 B2  10/2016  Kim
11,456,423 B2  9/2022  Zeng et al.
(Continued)

FOREIGN PATENT DOCUMENTS

KR  10-2038076 B1  10/2019
KR  10-2298851 B1  9/2021
(Continued)

*Primary Examiner* — Pegeman Karimi
(74) *Attorney, Agent, or Firm* — Womble Bond Dickinson (US) LLP

(57) ABSTRACT

A display panel includes: an element layer including a light emitting element; and a circuit layer including: a first transistor connected between a first drive voltage line and the light emitting element and operating according to a potential of a first node; a second transistor connected between a data line and a second node; a third transistor connected between the first transistor and the first node; a first capacitor electrode connected to the first node; a second capacitor electrode connected to the second node and facing the first capacitor electrode to form a first capacitor; a third capacitor electrode facing the second capacitor electrode to form a second capacitor and connected to the first drive voltage line; a first bridge electrode electrically connecting the first capacitor electrode and the third transistor; and a second bridge electrode electrically connecting the second capacitor electrode and the second transistor.

21 Claims, 15 Drawing Sheets

(58) Field of Classification Search
CPC .... G06F 3/0412; G06F 3/0416; G06F 3/0418; G06F 3/044; G06F 3/0446; G06F 2203/04102; G06F 2203/04103; G06F 2203/04107; G06F 2203/04111; G02F 1/133345; G02F 1/13338; G02F 1/13439; H05K 1/0216; H05K 1/11; H05K 1/118; H05K 3/361; H05K 2201/09245; H05K 2201/09254

See application file for complete search history.

(56) References Cited

U.S. PATENT DOCUMENTS

| | | | |
|---|---|---|---|
| 2014/0139502 A1* | 5/2014 | Han | G09G 3/3233 |
| | | | 345/212 |
| 2021/0210020 A1* | 7/2021 | Cho | G09G 3/3266 |
| 2022/0328592 A1 | 10/2022 | You | |
| 2023/0260456 A1* | 8/2023 | Yang | G09G 3/3659 |
| | | | 345/211 |
| 2023/0267882 A1* | 8/2023 | Yang | G09G 3/3233 |
| 2024/0257738 A1* | 8/2024 | Ha | G09G 3/3233 |

FOREIGN PATENT DOCUMENTS

| | | |
|---|---|---|
| KR | 10-2406949 B1 | 6/2022 |
| KR | 10-2022-0140920 A | 10/2022 |

\* cited by examiner

DISPLAY PANEL

CROSS-REFERENCE TO RELATED APPLICATIONS

The present application claims priority to and the benefit of Korean Patent Application No. 10-2023-0055599, filed on Apr. 27, 2023, in the Korean Intellectual Property Office, the entire disclosure of which is incorporated herein by reference.

BACKGROUND

1. Field

Aspects of some embodiments of the present disclosure described herein relate to a display panel.

2. Description of the Related Art

Among display devices, an emissive display device displays images using light emitting diodes that generate light by recombination of electrons and holes. The emissive display device generally has a relatively high response speed and may be driven with relatively low power consumption.

The emissive display device generally includes a display panel in which pixels connected to data lines and scan lines are arranged. In general, each of the pixels includes a light emitting diode and a pixel circuit for controlling the amount of current flowing to the light emitting diode. In response to a data signal, the pixel circuit controls the amount of current flowing from a first drive voltage line to a second drive voltage line via the light emitting diode. At this time, light having a set or predetermined luminance may be generated depending on the amount of current flowing through the light emitting diode.

The above information disclosed in this Background section is only for enhancement of understanding of the background and therefore the information discussed in this Background section does not necessarily constitute prior art.

SUMMARY

Aspects of some embodiments of the present disclosure described herein relate to a display panel, and for example, to a display panel having relatively high resolution.

Aspects of some embodiments of the present disclosure include a display panel applied to a display device that has relatively high resolution and operates in a variable frequency mode.

According to some embodiments, a display panel includes an element layer including a light emitting element and a circuit layer including a pixel circuit connected to the light emitting element.

According to some embodiments, the circuit layer includes a first transistor that is connected between a first drive voltage line and the light emitting element and that operates depending on a potential of a first node, a second transistor connected between a data line and a second node, a third transistor connected between the first transistor and the first node, a first capacitor electrode connected to the first node, a second capacitor electrode that is connected to the second node and that faces the first capacitor electrode to form a first capacitor, a third capacitor electrode that faces the second capacitor electrode to form a second capacitor and that is connected to the first drive voltage line, a first bridge electrode that electrically connects the first capacitor electrode and the third transistor, and a second bridge electrode that electrically connects the second capacitor electrode and the second transistor.

BRIEF DESCRIPTION OF THE DRAWINGS

The above and other aspects and characteristics of embodiments according to the present disclosure will become more apparent by describing in more detail aspects of some embodiments thereof with reference to the accompanying drawings.

DETAILED DESCRIPTION

Figure 1:
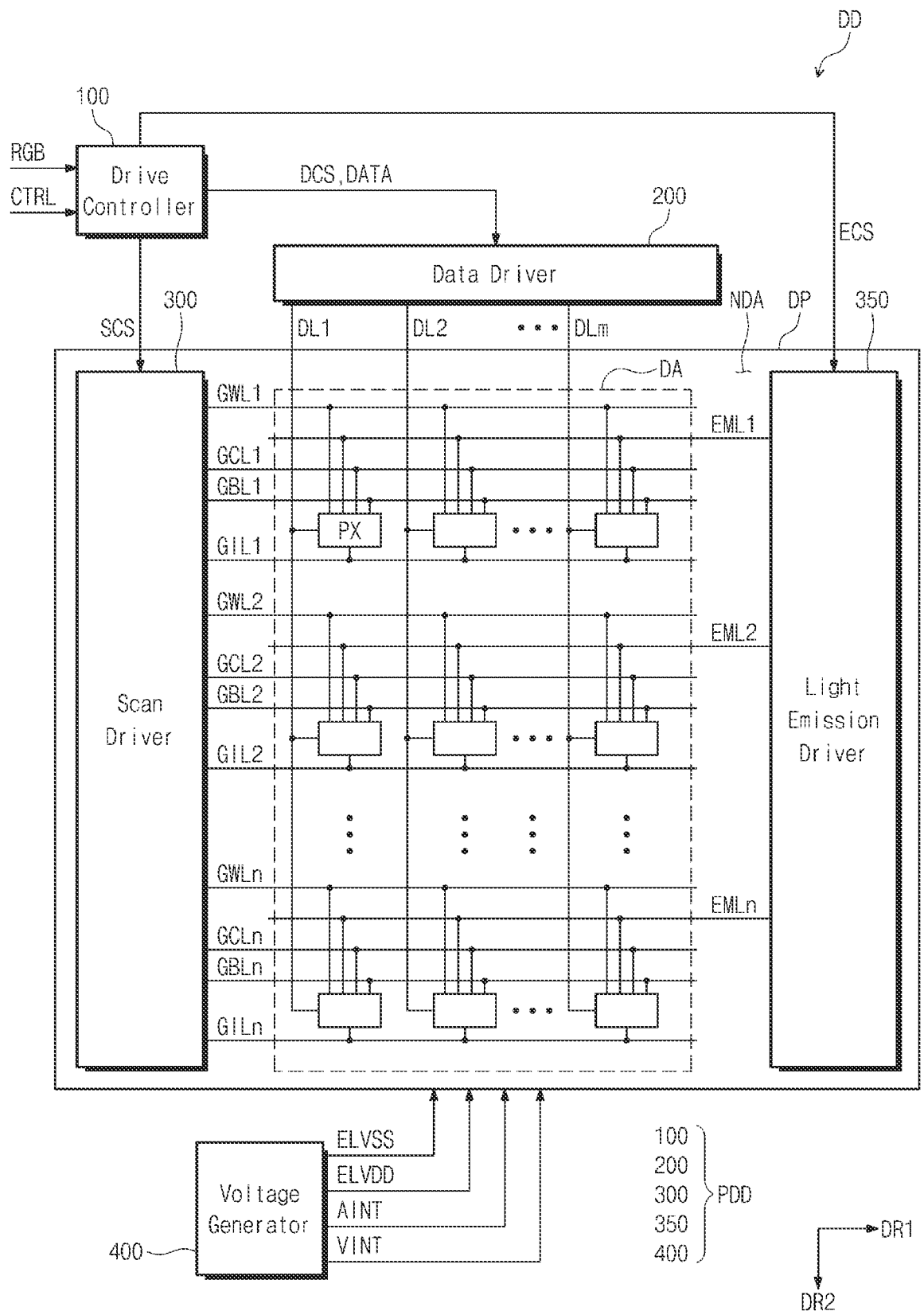
FIG. 1 is a block diagram of a display device according to some embodiments of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, aspects of some embodiments of the present disclosure will be described in more detail with reference to the accompanying drawings.

FIG. 1 is a block diagram of a display device according to some embodiments of the present disclosure.

Referring to FIG. 1, the display device DD may be activated according to an electrical signal and may display images. The display device DD may be applied to an electronic device such as a smart watch, a tablet computer, a notebook computer, a computer, a smart television, or the like.

The display device DD includes a display panel DP and a panel driver PDD that drives the display panel DP. According to some embodiments of the present disclosure, the panel driver PDD may include a drive controller 100, a data driver 200, a scan driver 300, a light emission driver 350, and a voltage generator 400.

The drive controller 100 receives an image signal RGB and a control signal CTRL. The drive controller 100 generates image data DATA by converting the data format of the image signal RGB according to the specification of an interface with the data driver 200. The drive controller 100 outputs a scan control signal SCS, a data control signal DCS, and a light emission drive control signal ECS.

The data driver 200 receives the data control signal DCS and the image data DATA from the drive controller 100. The data driver 200 converts the image data DATA into data signals and outputs the data signals to a plurality of data lines DL1 to DLm that will be described below. The data signals are analog data voltages corresponding to gray level values of the image data DATA.

The voltage generator 400 generates voltages required for operation of the display panel DP. According to some embodiments of the present disclosure, the voltage generator 400 generates a first drive voltage ELVDD, a second drive voltage ELVSS, a first initialization voltage VINT, and a second initialization voltage AINT. The first initialization voltage VINT and the second initialization voltage AINT may have different voltage levels. According to some embodiments of the present disclosure, the voltage generator 400 may additionally generate a bias voltage Vbias (refer to FIG. 2A) that is supplied to the display panel DP.

The scan driver 300 receives the scan control signal SCS from the drive controller 100. The scan control signal SCS may include a start signal to start operation of the scan driver 300 and a plurality of clock signals. The scan driver 300 generates a plurality of scan signals and sequentially outputs the plurality of scan signals to scan lines that will be described below. The light emission driver 350 may output light emission control signals to light emission control lines EML1 to EMLn, which will be described below, in response to the light emission drive control signal ECS from the drive controller 100. According to some embodiments, the scan driver 300 and the light emission driver 350 may be integrated into one circuit.

The scan driver 300 outputs initialization scan signals to initialization scan lines GIL1 to GILn of the display panel DP and outputs compensation scan signals to compensation scan lines GCL1 to GCLn of the display panel DP. The scan driver 300 outputs write scan signals to write scan lines GWL1 to GWLn of the display panel DP and outputs black scan signals to black scan lines GBL1 to GBLn of the display panel DP.

The display panel DP includes the initialization scan lines GIL1 to GILn, the compensation scan lines GCL1 to GCLn, the write scan lines GWL1 to GWLn, the black scan lines GBL1 to GBLn, the light emission control lines EML1 to EMLn, the data lines DL1 to DLm, and pixels PX. The display panel DP has a display region DA and a non-display region NDA defined therein. The initialization scan lines GIL1 to GILn, the compensation scan lines GCL1 to GCLn, the write scan lines GWL1 to GWLn, the black scan lines GBL1 to GBLn, the light emission control lines EML1 to EMLn, the data lines DL1 to DLm, and the pixels PX may be located in the display region DA. The initialization scan lines GIL1 to GILn, the compensation scan lines GCL1 to GCLn, the write scan lines GWL1 to GWLn, the black scan lines GBL1 to GBLn, and the light emission control lines EML1 to EMLn extend in a first direction DR1 and are arranged in a second direction DR2 so as to be spaced apart from each other. The data lines DL1 to DLm extend in the second direction DR2 and are arranged in the first direction DR1 so as to be spaced apart from each other.

The scan driver 300 and the light emission driver 350 may be located in the non-display region NDA of the display panel DP. According to some embodiments of the present disclosure, the scan driver 300 is located at or adjacent to a first side of the display region DA, and the light emission driver 350 is located adjacent to a second side of the display region DA that faces away from the first side. Although the scan driver 300 and the light emission driver 350 are located on the opposite sides of the display region DA in the embodiments illustrated with respect to FIG. 1, embodiments according to the present disclosure are not limited thereto. For example, the scan driver 300 and the light emission driver 350 may be located adjacent to one of the first and second sides of the display panel DP.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the light emission control lines EML1 to EMLn, and the data lines DL1 to DLm, respectively. Each of the plurality of pixels PX may be electrically connected to four scan lines and one light emission control line. For example, as illustrated in FIG. 1, a first row of pixels may be connected to a first initialization scan line GIL1, a first compensation scan line GCL1, a first write scan line GWL1, a first black scan line GBL1, and a first light emission control line EML1. In addition, a second row of pixels may be connected to a second initialization scan line GIL2, a second compensation scan line GCL2, a second write scan line GWL2, a second black scan line GBL2, and a second light emission control line EML2.

However, without being limited thereto, the numbers of scan lines and light emission control lines connected to each pixel PX may be varied.

Each of the plurality of pixels PX includes a light emitting element ED (refer to FIG. 2A) and a pixel circuit unit (or pixel circuit) PXC (refer to FIG. 2A) that controls light emission of the light emitting element ED. The pixel circuit unit PXC may include one or more transistors and one or more capacitors. The scan driver 300 and the light emission driver 350 may be directly formed in the non-display region NDA of the display panel DP through the same process as the transistors of the pixel circuit unit PXC.

Each of the plurality of pixels PX receives the first drive voltage ELVDD, the second drive voltage ELVSS, and the first and second initialization voltages VINT and AINT from the voltage generator 400. Alternatively, each of the plurality of pixels PX may additionally receive the bias voltage Vbias from the voltage generator 400.

Figure 2A:
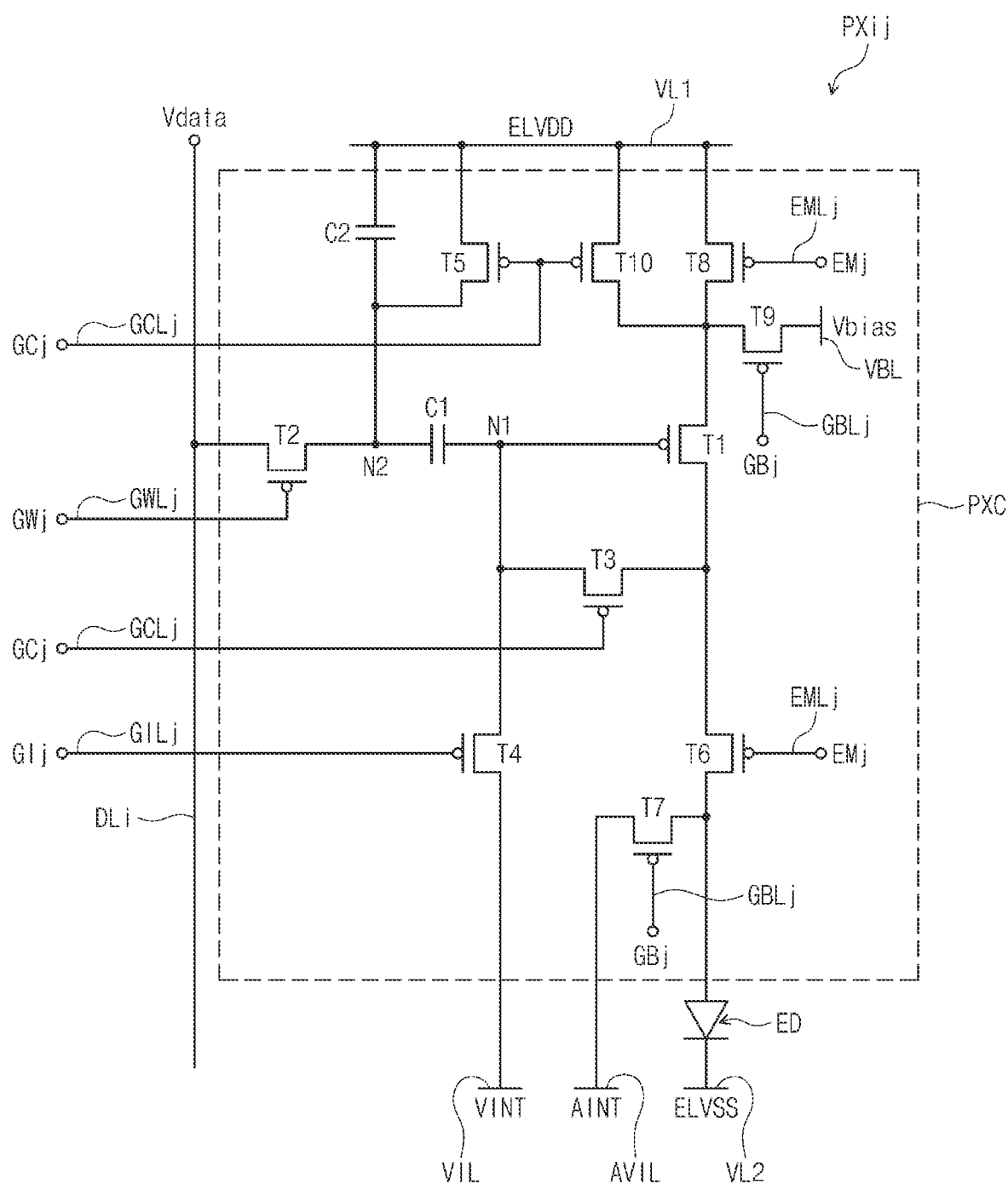
FIG. 2A is a circuit diagram of a pixel according to some embodiments of the present disclosure.
Figure 2B:
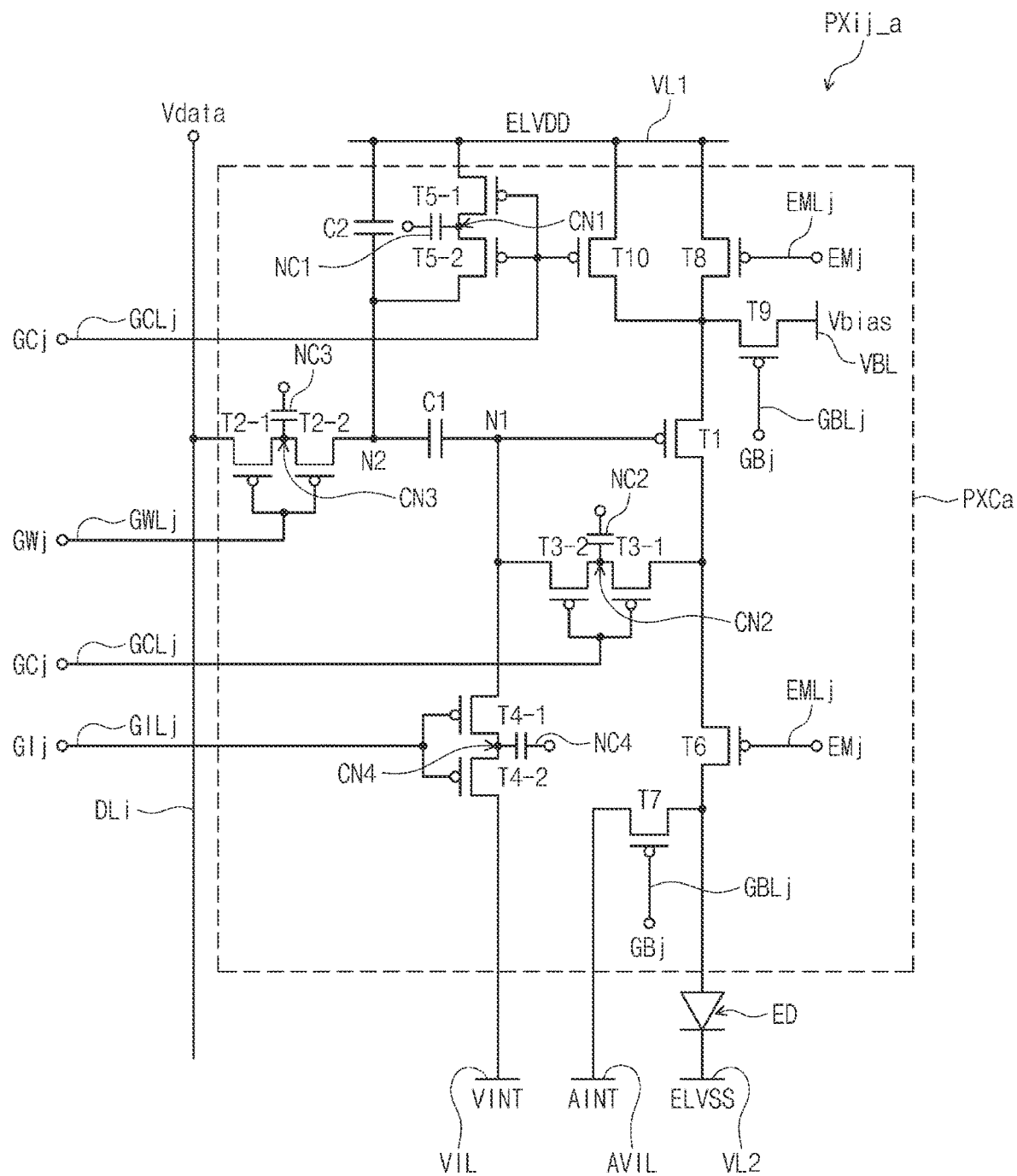
FIG. 2B is a circuit diagram of a pixel according to some embodiments of the present disclosure.
Figure 2C:
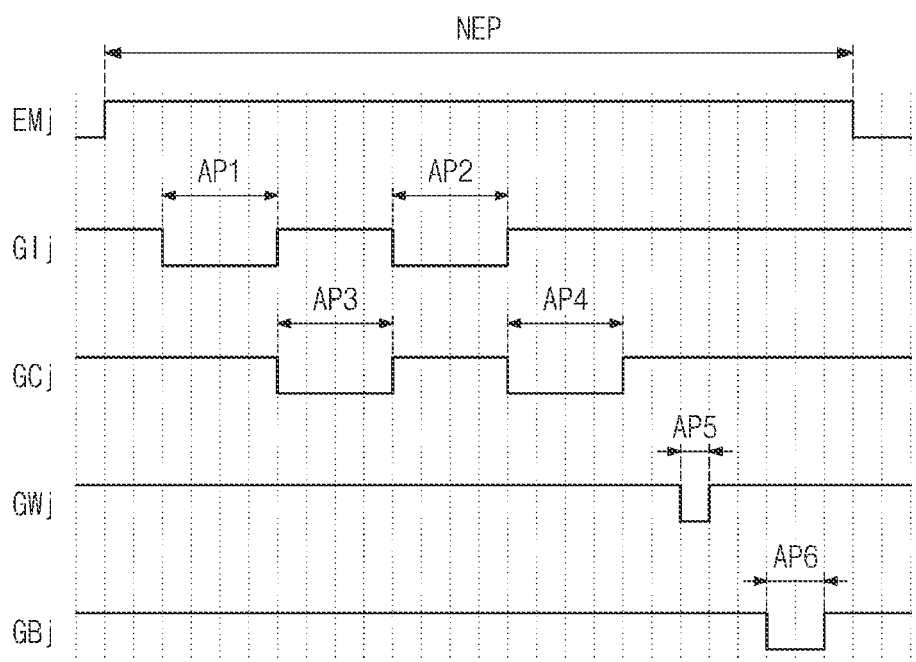
FIG. 2C is a timing chart for explaining operation of a pixel according to some embodiments of the present disclosure.

FIGS. 2A and 2B are circuit diagrams of pixels according to embodiments of the present disclosure, and FIG. 2C is a timing chart for explaining operations of the pixels according to some embodiments of the present disclosure.

The pixels PX illustrated in FIG. 1 may have the same configuration. Accordingly, the configurations of one pixel PXij or PXij_a among the pixels PX will be described with reference to FIGS. 2A and 2B, and descriptions of the configurations of the remaining pixels will be omitted.

Referring to FIG. 2A, the pixel PXij is connected to a j-th initialization scan line GILj among the initialization scan lines GIL1 to GILn, a j-th compensation scan line among the compensation scan lines GCL1 to GCLn, a j-th write scan line among the write scan lines GWL1 to GWLn, and a j-th black scan line among the black scan lines GBL1 to GBLn illustrated in FIG. 1. In addition, the pixel PXij is connected to an i-th data line DLi among the data lines DL1 to DLm illustrated in FIG. 1 and connected to a j-th light emission control line EMLj among the light emission control lines EML1 to EMLn.

Referring to FIG. 2A, the pixel PXij according to some embodiments includes the pixel circuit unit PXC and the light emitting element ED. According to some embodiments of the present disclosure, the pixel circuit unit PXC may include ten transistors and two capacitors. Hereinafter, the ten transistors are referred to as first to tenth transistors T1, T2, T3, T4, T5a, T6, T7, T8, T9, and T10, and the two capacitors are referred to as first and second capacitors C1 and C2. Embodiments according to the present disclosure are not limited to the components described above, and according to some embodiments, the pixel circuit unit PXC may include additional components or fewer components without departing from the spirit and scope of embodiments according to the present disclosure.

According to some embodiments, each of the first to tenth transistors T1 to T10 is a P-type transistor having a low-temperature polycrystalline silicon (LTPS) semiconductor layer. Alternatively, each of the first to tenth transistors T1 to T10 may be an N-type transistor. In another case, at least one of the first to tenth transistors T1 to T10 may be an N-type transistor, and the remaining transistors may be P-type transistors. At least one of the first to tenth transistors T1 to T10 may be a transistor having an oxide semiconductor layer. For example, some of the first to tenth transistors T1 to T10 may be oxide semiconductor transistors, and the remaining transistors may be LTPS transistors.

The circuit configuration of the pixel PXij according to some embodiments of the present disclosure is not limited to the circuit configuration illustrated in FIG. 2A. The pixel PXij illustrated in FIG. 2A is merely illustrative, and various changes and modifications may be made to the circuit configuration of the pixel PXij.

The j-th initialization scan line GILj supplies the j-th initialization scan signal GIj (or, the first scan signal) to the pixel PXij. The j-th write scan line GWLj supplies the j-th write scan signal GWj to the pixel PXij, and the j-th compensation scan line GCLj supplies the j-th compensation scan signal GCj (or, the second scan signal) to the pixel PXij. The j-th light emission control line EMLj supplies the j-th light emission control signal EMj to the pixel PXij, and the i-th data line DLi transfers the i-th data voltage Vdata to the pixel PXij. The i-th data voltage Vdata may have a voltage level corresponding to the image data DATA that is input to the display device DD (refer to FIG. 1).

The pixel PXij may be connected to a first drive voltage line VL1, a second drive voltage line VL2, a first initialization voltage line VIL, a second initialization voltage line AVIL, and a bias voltage line VBL.

The first drive voltage line VL1 transfers, to the pixel PXij, the first drive voltage ELVDD supplied from the voltage generator 400 illustrated in FIG. 1, and the second drive voltage line VL2 transfers, to the pixel PXij, the second drive voltage ELVSS supplied from the voltage generator 400. The first initialization voltage line VIL and the second initialization voltage line AVIL receive the first initialization voltage VINT and the second initialization voltage AINT from the voltage generator 400 and transfer the first initialization voltage VINT and the second initialization voltage AINT to the pixel PXij. The bias voltage line VBL receives the bias voltage Vbias from the voltage generator 400 and transfers the bias voltage Vbias to the pixel PXij.

Each of the first to tenth transistors T1 to T10 may include an input electrode (or, a source electrode), an output electrode (or, a drain electrode), and a control electrode (or, a gate electrode). In this specification, for convenience, the input electrode, the output electrode, and the control electrode may be referred to as the first electrode, the second electrode, and the third electrode.

The first transistor T1 (or, referred to as the drive transistor) may be provided between the first drive voltage line VL1 and the light emitting element ED. For example, the first transistor T1 includes the first electrode electrically connected to the first drive voltage line VL1, the second electrode electrically connected to the light emitting element ED, and the third electrode connected to a first node N1. The first transistor T1 may receive the first drive voltage ELVDD through the first drive voltage line VL1. The first electrode of the first transistor T1 may be connected to the first drive voltage line VL1 via the eighth transistor T8, and the second electrode of the first transistor T1 may be electrically connected to an anode of the light emitting element ED via the sixth transistor T6.

The second transistor T2 may be connected between the i-th data line DLi and a second node N2. For example, the second transistor T2 includes the first electrode connected to the i-th data line DLi, the second electrode connected to the second node N2, and the third electrode that receives the j-th write scan signal GWj through the j-th write scan line GWLj. During a data write period AP5 (refer to FIG. 2C), the second transistor T2 is turned on in response to the j-th write scan signal GWj provided to the j-th write scan line GWLj. The i-th data line DLi and the second node N2 may be electrically connected by the turned-on second transistor T2, and the i-th data voltage Vdata applied to the i-th data line DLi may be applied to the second node N2 through the turned-on second transistor T2. The data write period AP5 may be referred to as a fifth active period AP5.

The first capacitor C1 is connected between the first node N1 and the second node N2, and the second capacitor C2 is connected between the second node N2 and the first drive voltage line VL1. The first capacitor C1 includes a first electrode electrically connected to the first node N1 and a second electrode electrically connected to the second node N2. The second capacitor C2 includes a first electrode electrically connected to the first drive voltage line VL1 and a second electrode electrically connected to the second node N2.

The third transistor T3 is connected between the second electrode of the first transistor T1 and the third electrode of the first transistor T1. For example, the third transistor T3 includes the first electrode electrically connected to the second electrode of the first transistor T1, the second electrode electrically connected to the first node N1, and the third electrode that receives the j-th compensation scan signal GCj through the j-th compensation scan line GCLj. During compensation period AP3 and AP4 (refer to FIG. 2C), the third transistor T3 is turned on in response to the j-th compensation scan signal GCj provided to the j-th compensation scan line GCLj. During the compensation periods AP3 and AP4, the first transistor T1 may be connected in a diode form by the turned-on third transistor T3. The compensation periods AP3 and AP4 may include a third active period AP3 and a fourth active period AP4.

The fourth transistor T4 (or, referred to as the first initialization transistor) is electrically connected between the first node N1 and the first initialization voltage line VIL. For example, the fourth transistor T4 includes the first electrode electrically connected to the first node N1, the second electrode electrically connected to the first initialization voltage line VIL, and the third electrode that receives the j-th initialization scan signal GIj through the j-th initialization scan line GILj. The first initialization voltage VINT may be applied to the first initialization voltage line VIL. During initialization period AP1 and AP2 (refer to FIG. 2C), the fourth transistor T4 is turned on in response to the j-th initialization scan signal GIj provided to the j-th initialization scan line GILj. During the initialization period AP1 and AP2, the first node N1 may be initialized to the first initialization voltage VINT by the turned-one fourth transistor T4. The initialization period AP1 and AP2 may include a first active period AP1 and a second active period AP2.

The fifth transistor T5 may be electrically connected between the second node N2 and the first drive voltage line VL1. The fifth transistor T5 includes the first electrode connected to the first drive voltage line VL1, the second electrode electrically connected to the second node N2, and the third electrode that receives the j-th compensation scan signal GCj through the j-th compensation scan line GCLj. During the compensation periods AP3 and AP4, the fifth transistor T5 is turned on in response to the j-th compensation scan signal GCj provided to the j-th compensation scan line GCLj. The first drive voltage line VL1 and the second node N2 are electrically connected by the turned-on fifth transistor T5. That is, during the compensation periods AP3 and AP4, the first drive voltage ELVDD may be applied to the second node N2.

According to some embodiments of the present disclosure, the third electrodes of the third and fifth transistors T3 and T5 are commonly connected to the j-th compensation scan line GCLj. However, embodiments according to the present disclosure are not limited thereto. That is, the third electrode of the third transistor T3 and the third electrode of the fifth transistor T5 may be connected to different scan lines and may receive different scan signals.

The sixth transistor T6 (or, referred to as the first light emission control transistor) is connected between the second electrode of the first transistor T1 and the anode of the light emitting element ED. For example, the sixth transistor T6 includes the first electrode connected to the second electrode of the first transistor T1, the second electrode electrically connected to the anode of the light emitting element ED, and the third electrode electrically connected to the j-th light emission control line EMLj. During a non-light emission period NEP, the sixth transistor T6 may be turned on by the j-th light emission control signal EMj provided to the j-th light emission control line EMLj.

The seventh transistor T7 (or, referred to as the second initialization transistor) is connected between the second initialization voltage line AVIL and the anode of the light emitting element ED. The seventh transistor T7 includes the first electrode connected to the anode of the light emitting element ED, the second electrode connected to the second initialization voltage line AVIL, and the third electrode that receives the j-th black scan signal GBj (or, referred to as the initialization control signal) through the j-th black scan line GBLj. The second initialization voltage AINT may be applied to the second initialization voltage line AVIL. According to some embodiments of the present disclosure, the second initialization voltage AINT has a voltage level different from that of the first initialization voltage VINT. During a black period AP6 (refer to FIG. 2C), the seventh transistor T7 is turned on in response to the j-th black scan signal GBj provided to the j-th black scan line GBLj. During the black period AP6, the anode of the light emitting element ED may be initialized to the second initialization voltage AINT by the turned-on seventh transistor T7. Alternatively, the third electrode of the seventh transistor T7 may be connected to the (j+1)th write scan line and may receive the (j+1)th write scan signal as the j-th black scan signal GBj. The black period AP6 may be referred to as a sixth active period AP6.

The eighth transistor T8 (or, referred to as the first light emission control transistor) may be electrically connected between the first transistor T1 and the first drive voltage line VL1. For example, the eighth transistor T8 includes the first electrode electrically connected to the first drive voltage line VL1, the second electrode electrically connected to the first electrode of the first transistor T1, and the third electrode that receives the j-th light emission control signal EMj through the j-th light emission control line EMLj. During the non-light emission period NEP, the eighth transistor T8 may be turned on by the j-th light emission control signal EMj provided to the j-th light emission control line EMLj.

The ninth transistor T9 may be electrically connected between the first transistor T1 and the bias voltage line VBL. For example, the ninth transistor T9 includes the first electrode electrically connected to the bias voltage line VBL, the second electrode electrically connected to the first electrode of the first transistor T1, and the third electrode that receives the j-th black scan signal GBj through the j-th black scan line GBLj. During the black period AP6, the ninth transistor T9 is turned on in response to the j-th black scan signal GBj provided to the j-th black scan line GBLj. During the black period AP6, the bias voltage Vbias may be applied to the first electrode of the first transistor T1 through the turned-on ninth transistor T9.

The tenth transistor T10 may be electrically connected between the first transistor T1 and the first drive voltage line VL1. For example, the tenth transistor T10 includes the first electrode electrically connected to the first drive voltage line VL, the second electrode electrically connected to the first electrode of the first transistor T1, and the third electrode that receives the j-th compensation scan signal GCj through the j-th compensation scan line GCLj. The third electrode of the tenth transistor T10 and the third electrode of the fifth transistor T5 are commonly connected to the j-th compensation scan line GCLj. During the compensation periods AP3 and AP4, the tenth transistor T10 is turned on in response to the j-th compensation scan signal GCj provided to the j-th compensation scan line GCLj. The first drive voltage line VL1 and the first electrode of the first transistor T1 are electrically connected by the turned-on tenth transistor T10. That is, during the compensation periods AP3 and AP4, the first drive voltage ELVDD may be applied to the first electrode of the first transistor T1.

The light emitting element ED may be electrically connected between the sixth transistor T6 and the second drive voltage line VL2. The anode of the light emitting element ED is connected to the second electrode of the sixth transistor T6, and a cathode of the light emitting element ED is connected to the second drive voltage line VL2. The second drive voltage ELVSS may be applied to the second drive voltage line VL2. The second drive voltage ELVSS has a lower level than the first drive voltage ELVDD. Accordingly, the light emitting element ED may emit light depending on a voltage corresponding to a difference between a signal transferred through the sixth transistor T6 and the second drive voltage EVLSS.

The pixel PXij includes the ten transistors T1 to T10 and the two capacitors C1 and C2. The circuit area of the pixel PXij may be minimized by minimizing the number of transistors in the pixel PXij. The pixel PXij is connected to four voltage lines for receiving the first drive voltage ELVDD, the second drive voltage ELVSS, the first initialization voltage VINT, and the bias voltage Vbias. In addition, the pixel PXij operates in response to four scan lines GILj, GCLj, GWLj, and GBLj and one light emission control line EMLj. By minimizing the numbers of voltage lines, scan lines, and light emission control lines connected to the pixel PXij, the area occupied by the pixel circuit unit PXC may be reduced, and thus the resolution of the display panel DP may be improved.

Referring to FIG. 2B, the pixel PXij_a according to some embodiments includes a pixel circuit unit PXCa and a light emitting element ED. According to some embodiments of the present disclosure, the pixel circuit unit PXCa may include ten transistors and two capacitors. Hereinafter, the ten transistors are referred to as the first to tenth transistors T1, T2a, T3a, T4a, T5a, T6, T7, T8, T9, and T10, and the two capacitors are referred to as the first and second capacitors C1 and C2. The pixel circuit unit PXCa may further include at least one node capacitor. According to some embodiments of the present disclosure, the pixel circuit unit PXCa includes four node capacitors. However, the number of node capacitors is not particularly limited. Hereinafter, the four node capacitors are referred to as first to fourth node capacitors NC1, NC2, NC3, and NC4.

According to some embodiments of the present disclosure, among the first to tenth transistors T1 to T10, at least one transistor may have a structure (e.g., a dual transistor structure) including a plurality of sub-transistors connected in series. When at least one of the first to tenth transistors T1 to T10 has a dual transistor structure, leakage current during turn-off may be reduced. Alternatively, at least one of the first to tenth transistors T1 to T10 may have a dual gate structure including two third electrodes (that is, gate electrodes).

The fifth transistor T5a may include a plurality of first sub-transistors connected in series between the first drive voltage line VL1 and the second node N2. Although two first sub-transistors are illustrated in FIG. 2B, the number of first sub-transistors is not particularly limited. The two first sub-transistors may be referred to as a fifth-first transistor T5-1 and a fifth-second transistor T5-2. A node where the fifth-first transistor T5-1 and the fifth-second transistor T5-2 are coupled may be referred to as a first intermediate node CN1. The fifth-first transistor T5-1 is connected between the first drive voltage line VL1 and the first intermediate node CN1, and the fifth-second transistor T5-2 is connected between the first intermediate node CN1 and the second node N2. The fifth-first transistor T5-1 includes a first electrode connected with the first drive voltage line VL1, a second electrode connected with the first intermediate node CN1, and a third electrode connected to the j-th compensation scan line GCLj. The fifth-second transistor T5-2 includes a first electrode connected with the first intermediate node CN1, a second electrode connected with the second node N2, and a third electrode connected to the j-th compensation scan line GCLj.

The first node capacitor NC1 may be connected to the first intermediate node CN1. For example, a first node capacitor electrode NCE1 (refer to FIG. 5B) of the first node capacitor NC1 may have a shape extending from the first electrode of the fifth-second transistor T5-2.

The third transistor T3a may include a plurality of second sub-transistors connected in series between a second electrode of the first transistor T1 and the first node N1. Although two second sub-transistors are illustrated in FIG. 2B, the number of second sub-transistors is not particularly limited. The two second sub-transistors may be referred to as a third-first transistor T3-1 and a third-second transistor T3-2. A node where the third-first transistor T3-1 and the third-second transistor T3-2 are coupled may be referred to as a second intermediate node CN2. The third-first transistor T3-1 is connected between the second electrode of the first transistor T1 and the second intermediate node CN2, and the third-second transistor T3-2 is connected between the second intermediate node CN2 and the first node N1. The third-first transistor T3-1 includes a first electrode connected with the second electrode of the first transistor T1, a second electrode connected with the second intermediate node CN2, and a third electrode connected to the j-th compensation scan line GCLj. The third-second transistor T3-2 includes a first electrode connected with the second intermediate node CN2, a second electrode connected with the first node N1, and a third electrode connected to the j-th compensation scan line GCLj.

The second node capacitor NC2 may be connected to the second intermediate node CN2. For example, a second node capacitor electrode NCE2 (refer to FIG. 5B) of the second node capacitor NC2 may have a shape extending from the first electrode of the third-second transistor T3-2.

The second transistor T2a may include a plurality of third sub-transistors connected in series between the i-th data line DLi and the second node N2. Although two third sub-transistors are illustrated in FIG. 2B, the number of third sub-transistors is not particularly limited. The two third sub-transistors may be referred to as a second-first transistor T2-1 and a second-second transistor T2-2. A node where the second-first transistor T2-1 and the second-second transistor T2-2 are coupled may be referred to as a third intermediate node CN3. The second-first transistor T2-1 is connected between the i-th data line DLi and the third intermediate node CN3, and the second-second transistor T2-2 is connected between the third intermediate node CN3 and the second node N2. The second-first transistor T2-1 includes a first electrode connected with the i-th data line DLi, a second electrode connected with the third intermediate node CN3, and a third electrode connected to the j-th write scan line GWLj. The second-second transistor T2-2 includes a first electrode connected with the third intermediate node CN3, a second electrode connected with the second node N2, and a third electrode connected to the j-th write scan line GWLj.

The third node capacitor NC3 may be connected to the third intermediate node CN3. For example, a third node capacitor electrode NCE3 (refer to FIG. 5B) of the third node capacitor NC3 may have a shape extending from the first electrode of the second-second transistor T2-2.

The fourth transistor T4a may include a plurality of fourth sub-transistors connected in series between the first initialization voltage line VIL and the first node N1. Although two fourth sub-transistors are illustrated in FIG. 2B, the number of fourth sub-transistors is not particularly limited. The two fourth sub-transistors may be referred to as a fourth-first transistor T4-1 and fourth-second transistor T4-2. A node where the fourth-first transistor T4-1 and the fourth-second transistor T4-2 are coupled may be referred to as a fourth intermediate node CN4. The fourth-first transistor T4-1 is connected between the first node N1 and the fourth intermediate node CN4, and the fourth-second transistor T4-2 is connected between the fourth intermediate node CN4 and the first initialization voltage line VIL. The fourth-first transistor T4-1 includes a first electrode connected with the first node N1, a second electrode connected with the fourth intermediate node CN4, and a third electrode connected to the j-th initialization scan line GILj. The fourth-second transistor T4-2 includes a first electrode connected with the fourth intermediate node CN4, a second electrode connected with the initialization voltage line VIL, and a third electrode connected to the j-th initialization scan line GILj.

The fourth node capacitor NC4 may be connected to the fourth intermediate node CN4. For example, a fourth node capacitor electrode NCE4 (refer to FIG. 5B) of the fourth node capacitor NC4 may have a shape extending from the first electrode of the fourth-second transistor T4-2.

By additionally forming the node capacitors at the intermediate nodes of the transistors having the dual transistor structure as described above, leakage current blocking effects of the corresponding transistors may be further improved.

Although only the j-th scan signals GIj, GCj, GWj, and GBj and the j-th light emission control signal EMj are illustrated in FIG. 2C, the remaining scan signals and the remaining light emission control signals also similarly operate, and therefore detailed descriptions thereabout will be omitted.

Referring to FIGS. 2A to 2C, the j-th light emission control signal EMj includes the non-light emission period NEP. According to some embodiments of the present disclosure, the non-light emission period NEP may be defined as an inactive period (that is, a high level period) of the j-th light emission control signal EMj. A low level period of the j-th light emission control signal EMj may be defined as a light emission period.

The j-th initialization scan signal GIj may have the first and second active periods AP1 and AP2 (that is, the low level periods) during the non-light emission period NEP. The j-th initialization scan signal GIj is supplied to the fourth transistor T4 through the j-th initialization scan line GILj, and the fourth transistor T4 is turned on during the first and second active periods AP1 and AP2 in which the j-th initialization scan signal GIj is activated. During the first and second active periods AP1 and AP2, the potential of the first node N1 may be initialized to the first initialization voltage VINT by the turned-one fourth transistor T4. That is, as the j-th initialization scan signal GIj includes the two active periods AP1 and AP2, the first node N1 may be initialized twice within the non-light emission period NEP. Each of the first and second active periods AP1 and AP2 may be defined as an initialization period. The number of active periods of the j-th initialization scan signal GIj generated in the non-light emission period NEP is not particularly limited.

Among the j-th scan signals GIj, GCj, GWj, and GBj, the j-th compensation scan signal GCj may have the third and fourth active periods AP3 and AP4 during the non-light emission period NEP.

When the j-th compensation scan signal GCj is supplied to the third, fifth, and tenth transistors T3, T5, and T10 through the j-th compensation scan line GCLj, the third, fifth, and tenth transistors T3, T5, and T10 are turned on in the third and fourth active periods AP3 and AP4. The first transistor T1 is diode-connected by the turned-on third transistor T3 and is forward-biased. Then, a compensation voltage "ELVDD-Vth" obtained by subtracting the threshold voltage Vth of the first transistor T1 from the first drive voltage ELVDD may be applied to the first node N1. That is, the potential of the first node N1 may be compensated with the compensation voltage "ELVDD-Vth" in the third and fourth active periods AP3 and AP4. During the third and fourth active periods AP3 and AP4, the first drive voltage ELVDD is applied to the second node N2 through the turned-on fifth transistor T5, and the first drive voltage ELVDD is applied to the first electrode of the first transistor T1 through the turned-on tenth transistor T10.

The third and fourth active periods AP3 and AP4 may be defined as compensation periods. The duration time of each of the third and fourth active periods AP3 and AP4 may be equal to the duration time of each of the first and second active periods AP1 and AP2.

Among the j-th scan signals GIj, GCj, GWj, and GBj, the j-th write scan signal GWj may have the fifth active period AP5 during the non-light emission period NEP, and the j-th black scan signal GBj may have the sixth active period AP6 during the non-light emission period NEP.

The j-th write scan signal GWj is supplied to the second transistor T2 through the j-th write scan line GWLj, and the second transistor T2 is turned on in the fifth active period AP5. The i-th data voltage Vdata may be applied to the second node N2 through the turned-on second transistor T2. Then, the potential of the second node N2 is changed from the first drive voltage ELVDD to the i-th data voltage Vdata. The amount of change in the voltage of the second node N2 (Vdata-ELVDD) may be transferred to the first node N1 by coupling of the first capacitor C1. As the voltage of the first node N1 in the third and fourth active periods AP3 and AP4 is "ELVDD-Vth", the voltage of the first node N1 in the fifth active period AP5 is changed to "ELVDD-Vth+(Vdata-ELVDD)". The fifth active period AP5 may be referred to as a data write period in which a voltage corresponding to the i-th data voltage Vdata is stored in the first capacitor C1.

The j-th black scan signal GBj is supplied to the seventh transistor T7 and the ninth transistor T9 through the j-th black scan line GBLj, and the seventh transistor T7 and the ninth transistor T9 are turned on during the sixth active period AP6. During the sixth active period AP6, the second initialization voltage AINT may be applied to the anode of the light emitting element ED through the turned-on seventh transistor T7. Then, the anode of the light emitting element ED may be initialized to the second initialization voltage AINT. Furthermore, during the sixth active period AP6, the bias voltage Vbias may be applied to the first electrode of the first transistor T1 through the turned-on ninth transistor T9. By providing the bias voltage Vbias to the first electrode of the first transistor T1 as described above, an effect of hysteresis depending on a change in the threshold voltage (Vth) characteristics of the first transistor T1 may be minimized.

The sixth active period AP6 may be referred to as a black period. The duration time of the sixth activation period AP6 may be greater than the duration time of the fifth activation period AP5. Alternatively, the sixth active period AP6 may include a plurality of sub-active periods, and the duration time of each of the sub-active periods may be equal to the duration time of the fifth active period AP5.

The duration time of each of the first to fourth active periods AP1 to AP4 may be greater than or equal to the duration time of each of the fifth and sixth active periods AP5 and AP6. Although FIG. 2C illustrates an example that the duration time of each of the first to fourth active periods AP1 to AP4 is four times greater than the duration time of the fifth active period AP5, embodiments according to the present disclosure are not limited thereto. Alternatively, the duration time of each of the first to fourth active periods AP1 to AP4 may be two or three times greater than the duration time of the fifth active period AP5.

Figure 3A:
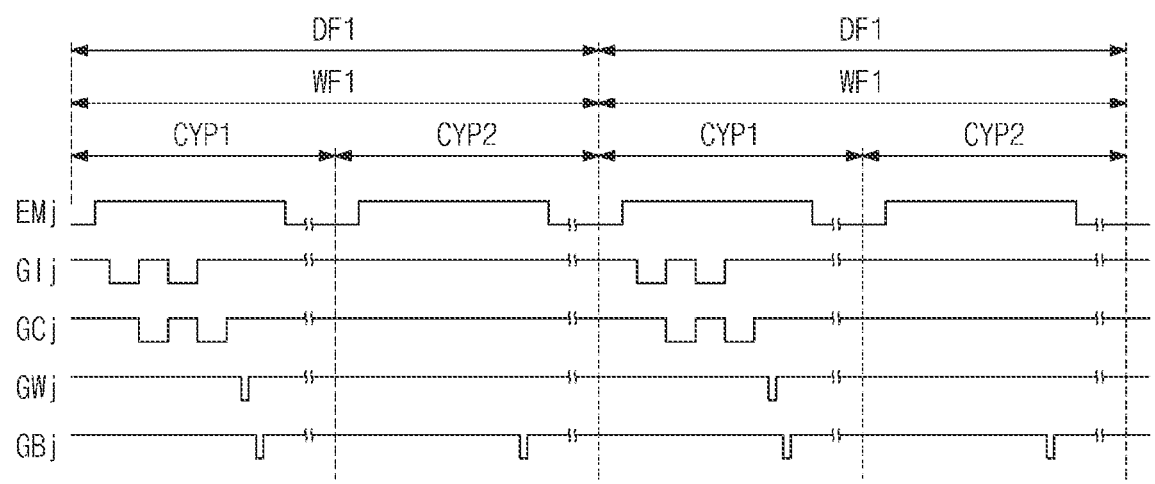
FIG. 3A is a timing chart for explaining the display device operating at a first drive frequency in a variable frequency mode according to some embodiments of the present disclosure.
Figure 3B:
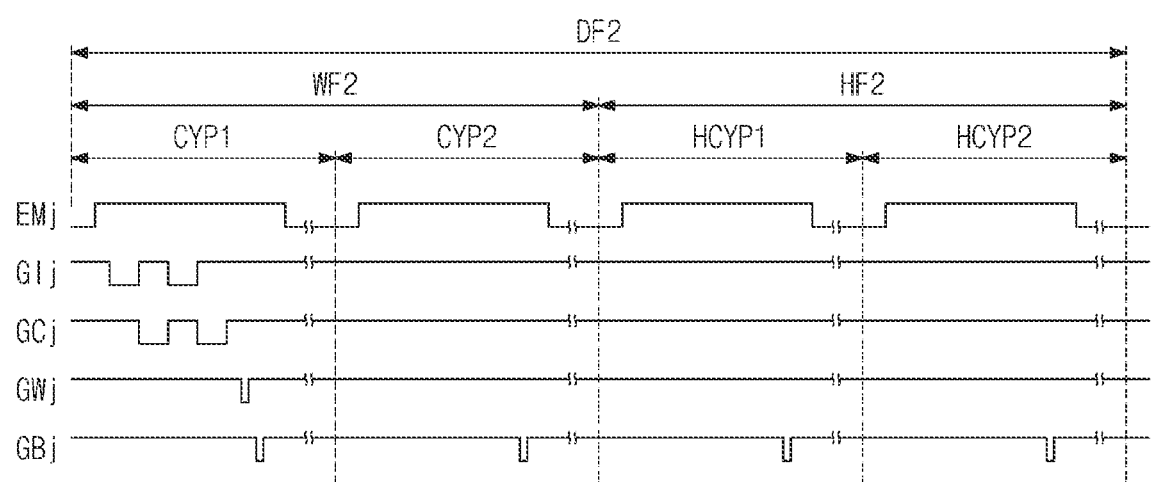
FIG. 3B is a timing chart for explaining the display device operating at a second drive frequency in the variable frequency mode according to some embodiments of the present disclosure.

FIG. 3A is a timing chart for explaining the display device operating at a first drive frequency in a variable frequency mode according to some embodiments of the present disclosure, and FIG. 3B is a timing chart for explaining the display device operating at a second drive frequency in the variable frequency mode according to some embodiments of the present disclosure.

Referring to FIGS. 1, 3A, and 3B, the display device DD may operate in a normal frequency mode (or, a first mode) in which a drive frequency is fixed (that is, not varied), or may operate in a variable frequency mode (or, a second mode) in which a drive frequency is varied. In the variable frequency mode, the drive frequency may be varied depending on a frame rate. FIG. 3A illustrates the case in which the display device DD operates at the first drive frequency in the variable frequency mode, and FIG. 3B illustrates the case in which the display device DD operates at the second drive frequency in the variable frequency mode. According to some embodiments of the present disclosure, the first drive frequency may be the highest drive frequency at which the display device DD is capable of operating. For example, the first drive frequency may be 240 Hz or 480 Hz. The first drive frequency may be referred to as the reference frequency or the maximum frequency. The second drive frequency may be a frequency lower than the first drive frequency. According to some embodiments of the present disclosure, the second drive frequency may be a frequency corresponding to one of compensation frequencies preset in the panel driver PDD (e.g., the drive controller 100).

As illustrated in FIGS. 1 and 3A, when the display device DD operates at the first drive frequency in the variable frequency mode, the scan signals GIj, GCj, GWj, and GBj and the light emission control signals EMj may be activated within a first drive frame DF1. According to some embodiments of the present disclosure, an active period in which each of the scan signals GIj, GCj, GWj, and GBj and the light emission control signals EMj is activated may be defined as a low level period, and an inactive period in which each of the scan signals GIj, GCj, GWj, and GBj and the light emission control signals EMj is deactivated may be defined as a high level period. According to some embodiments of the present disclosure, the first drive frame DF1 may include a first write frame WF1. The first write frame WF1 may include a first cycle section CYP1 and a second cycle section CYP2.

Among the scan signals GIj, GCj, GWj, and GBj, the scan signals GIj, GCj, and GWj may be activated only in the first cycle section CYP1 and may remain in a deactivated state in the second cycle section CYP2. According to some embodiments of the present disclosure, the black scan signal GBj and the light emission control signal EMj may be activated in the first and second cycle sections CYP1 and CYP2. The j-th initialization scan signal GIj, the j-th compensation scan signal GCj, and the j-th write scan signal GWj may be activated only in the first cycle section CYP1. That is, the j-th black scan signal GBj and the j-th light emission control signal EM1 are activated in units of one cycle section, and the j-th initialization scan signal GIj, the j-th compensation scan signal GCj, and the j-th write scan signal GWj are activated in units of one first write frame WF1. Accordingly, the frequencies of the j-th black scan signal GBj and the j-th light emission control signal EMj may be greater than the frequencies of the j-th initialization scan signal GIj, the j-th compensation scan signal GCj, and the j-th write scan signal GWj.

As illustrated in FIGS. 1, 2B, and 3B, the display device DD may operate at the second drive frequency different from the first drive frequency in the variable frequency mode. According to some embodiments of the present disclosure, the second drive frequency may be a frequency lower than the first drive frequency. For example, the second drive frequency may be about 48 Hz or about 96 Hz. When the display device DD operates at the second drive frequency, the scan signals GIj, GCj, GWj, and GBj and the light emission control signal EMj may be activated within a second drive frame DF2.

According to some embodiments of the present disclosure, the second drive frame DF2 may include a second write frame WF2 and at least one holding frame HF2. The duration time of the second write frame WF2 may be equal to the duration time of the first write frame WF1. The duration time of the holding frame HF2 may be equal to the duration time of the second write frame WF2. The number of holding frames HF2 included in the second drive frame DF2 may vary depending on the magnitude of the second drive frequency.

Among the scan signals GIj, GCj, GWj, and GBj, the scan signals GIj, GCj, and GWj may be activated only within the second write frame WF2 and may remain in a deactivated state in the holding frame HF2. The second write frame WF2 may include a first cycle section CYP1 and a second cycle section CYP2. The holding frame HF2 may include a first holding cycle section HCYP1 and a second holding cycle section HCYP2. According to some embodiments of the present disclosure, each of the first and second holding cycle sections HCYP1 and HCYP2 may have the same duration time as the first and second cycle sections CYP1 and CYP2.

Among the scan signals GIj, GCj, GWj, and GBj, the scan signals GIj, GCj, and GWj may be activated only in the first cycle section CYP1 of the second write frame WF2 and may remain in a deactivated state in the second cycle section CYP2. The j-th black scan signal GBj and the j-th light emission control signal EMj may be activated within the second write frame WF2 and the holding frame HF2. That is, the j-th black scan signal GBj and the j-th light emission control signal EMj are activated in units of one cycle section, and the j-th initialization scan signal GIj, the j-th compensation scan signal GCj, and the j-th write scan signal GWj are activated in units of one second write frame WF2. Accordingly, the frequencies of the j-th black scan signal GBj and the j-th light emission control signal EMj may be greater than the frequencies of the j-th initialization scan signal GIj, the j-th compensation scan signal GCj, and the j-th write scan signal GWj.

Figure 4:
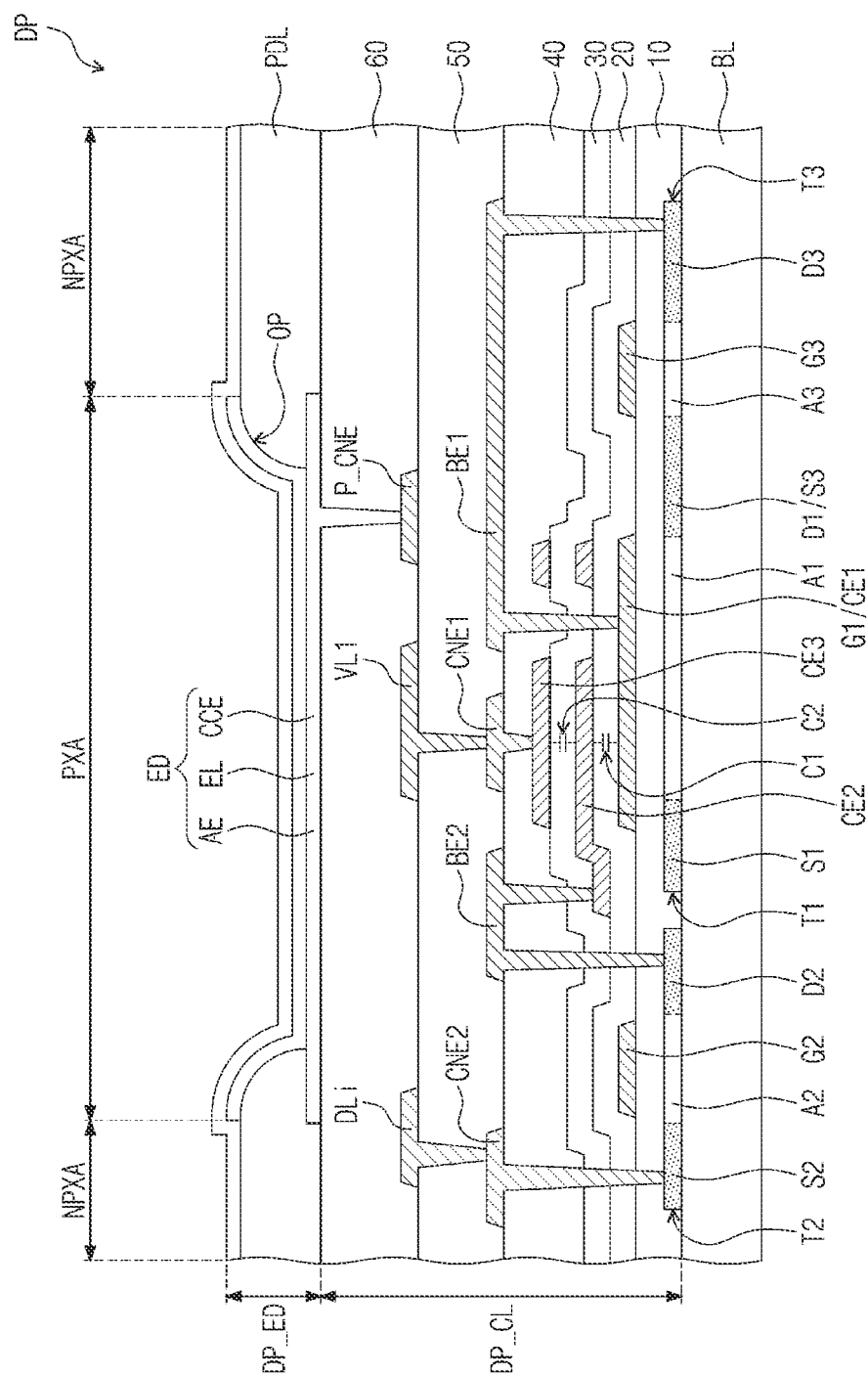
FIG. 4 is a cross-sectional view of a display panel according to some embodiments of the present disclosure.

FIG. 4 is a sectional view of the display panel according to some embodiments of the present disclosure.

Referring to FIG. 4, the display panel DP may include a base layer BL, a circuit layer DP_CL, and an element layer DP_ED.

The base layer BL may include a synthetic resin layer. The synthetic resin layer may include a thermosetting resin. For example, the synthetic resin layer may be a polyimide-based resin layer, and the material thereof is not particularly limited. The synthetic resin layer may include at least one of an acrylate-based resin, a methacrylate-based resin, a polyisoprene-based resin, a vinyl-based resin, an epoxy-based resin, a urethane-based resin, a celluose-based resin, a siloxane-based resin, a polyamide-based resin, or a perylene-based resin. In addition, the base layer BL may include a glass substrate, a metal substrate, or an organic/inorganic composite substrate.

At least one inorganic layer may be formed on an upper surface of the base layer BL. The inorganic layer may include at least one of aluminum oxide, titanium oxide, silicon oxide, silicon oxy-nitride, zirconium oxide, or hafnium oxide. The inorganic layer may be formed of multiple layers. The multiple inorganic layers may constitute a barrier layer and/or a buffer layer. The barrier layer and the buffer layer may be selectively arranged.

The barrier layer prevents infiltration of foreign matter from the outside. The barrier layer BRL may include a silicon oxide layer and a silicon nitride layer. A plurality of silicon oxide layers and a plurality of silicon nitride layers may be provided. The silicon oxide layers and the silicon nitride layers may be alternately stacked one above another.

The buffer layer may be located on the barrier layer. The buffer layer improves a coupling force between the base layer and a semiconductor pattern and/or a conductive pattern. The buffer layer may include silicon oxide layers and silicon nitride layers. The silicon oxide layers and the silicon nitride layers may be alternately stacked one above another. The barrier layer and the buffer layer may be omitted.

The circuit layer DP_CL is located on the base layer BL. The circuit layer DP_CL includes first to third semiconductor patterns located on the base layer BL. The first to third semiconductor patterns may include a silicon semiconductor. The first to third semiconductor patterns may include poly silicon. However, without being limited thereto, the first to third semiconductor patterns may include amorphous silicon or an oxide semiconductor.

The first to third semiconductor patterns have different electrical properties depending on whether the first to third semiconductor patterns are doped or not. Each of the first to third semiconductor patterns may include a doped region and an undoped region. The doped region may be doped with an N-type dopant or a P-type dopant. A P-type transistor includes a doped region doped with a P-type dopant, and an N-type transistor includes a doped region doped with an N-type dopant.

The doped region has a higher conductivity than the undoped region and substantially serves as an electrode or a signal line. The undoped region substantially corresponds to a channel part of a transistor. In other words, one portion of each of the first to third semiconductor patterns may be a channel part of a transistor, another portion may be a source or drain of the transistor, and another portion may be a connecting signal line (or, a connecting electrode).

As illustrated in FIG. 4, the first electrode S1, a channel part A1, and the second electrode D1 of the first transistor T1 are formed from the first semiconductor pattern. The first electrode S1 and the second electrode D1 of the first transistor T1 extend from the channel part A1 in opposite directions. The first electrode S2, a channel part A2, and the second electrode D2 of the second transistor T2 are formed from the second semiconductor pattern. The first electrode S2 and the second electrode D2 of the second transistor T2 extend from the channel part A2 in opposite directions. The first electrode S3, a channel part A3, and the second electrode D3 of the third transistor T3 are formed from the third semiconductor pattern. The first electrode S3 and the second electrode D3 of the third transistor T3 extend from the channel part A3 in opposite directions. The first electrode S3 of the third transistor T3 and the second electrode D1 of the first transistor T1 may be integrally formed with each other.

A first insulating layer 10 (or, a gate insulating layer) is located on the base layer BL. The first insulating layer 10 commonly overlaps the plurality of pixels PX and covers the first to third semiconductor patterns. The first insulating layer 10 may be an inorganic layer and/or an organic layer and may have a single-layer structure or a multi-layer structure. The first insulating layer 10 may include at least one of aluminum oxide, titanium oxide, silicon oxide, silicon oxy-nitride, zirconium oxide, or hafnium oxide. According to some embodiments, the first insulating layer 10 may be a single silicon oxide layer. Not only the first insulating layer 10 but also insulating layers of the circuit layer DP_CL to be described below may be inorganic layers and/or organic layers and may have a single-layer structure or a multi-layer structure. The inorganic layers may include at least one of the aforementioned materials.

The third electrode G1 of the first transistor T1, the third electrode G2 of the second transistor T2, and the third electrode G3 of the third transistor T3 are located on the first insulating layer 10. The third electrode G1 of the first transistor T1 overlaps the channel part A1 of the first transistor T1, the third electrode G2 of the second transistor T2 overlaps the channel part A2 of the second transistor T2, and the third electrode G3 of the third transistor T3 overlaps the channel part A3 of the third transistor T3.

A first capacitor electrode CE1 is additionally located on the first insulating layer 10. The first capacitor electrode CE1 may extend from the third electrode G1 of the first transistor T1 and may be integrally formed with the third electrode G1 of the first transistor T1. The third electrode G1 of the first transistor T1 and the first capacitor electrode CE1 may be portions of a first gate pattern layer 120 illustrated in FIG. 5B.

A second insulating layer 20 that covers the third electrode G1 of the first transistor T1 and the first capacitor electrode CE1 is located on the first insulating layer 10. The second insulating layer 20 commonly overlaps the plurality of pixels PX. The second insulating layer 20 may be an inorganic layer and/or an organic layer and may have a single-layer structure or a multi-layer structure. According to some embodiments, the second insulating layer 20 may be a single silicon oxide layer.

A second capacitor electrode CE2 may be located on the second insulating layer 20. The second capacitor electrode CE2 faces the first capacitor electrode CE1 with the second insulating layer 20 therebetween to form the first capacitor C1. The second capacitor electrode CE2 may be a portion of a second gate pattern layer 130 illustrated in FIG. 5C.

A third insulating layer 30 that covers the second capacitor electrode CE2 is located on the second insulating layer 20. According to some embodiments, the third insulating layer 30 may be a single silicon oxide layer.

A third capacitor electrode CE3 of the second capacitor C2 may be located on the third insulating layer 30. The third capacitor electrode CE3 faces the second capacitor electrode CE2 with the third insulating layer 30 therebetween to form the second capacitor C2. The third capacitor electrode CE3 may be a portion of an additional pattern layer 135 illustrated in FIG. 5D. On the section, the first capacitor C1 may be located between the second capacitor C2 and the first transistor T1.

A first bridge electrode BE1 and a second bridge electrode BE2 are located on a fourth insulating layer 40. The first bridge electrode BE1 may be an electrode that connects the third electrode G3 of the first transistor T1 (or, the first capacitor electrode CE1) and the second electrode D3 of the third transistor T3. The first bridge electrode BE1 is connected with the third electrode G3 of the first transistor T1 (or, the first capacitor electrode CE1) through a contact hole penetrating the second to fourth insulating layers 20, 30, and 40. Furthermore, the first bridge electrode BE1 is connected with the second electrode D3 of the third transistor T3 through a contact hole penetrating the first to fourth insulating layers 10, 20, 30, and 40. The second bridge electrode BE2 may be an electrode that connects the second capacitor electrode CE2 and the second electrode D2 of the second transistor T2. The second bridge electrode BE2 is connected with the second capacitor electrode CE2 through a contact hole penetrating the third and fourth insulating layers 30 and 40 and is connected with the second electrode D2 of the second transistor T2 through a contact hole penetrating the first to fourth insulating layers 10, 20, 30, and 40. In the present disclosure, the first bridge electrode BE1 may correspond to the first node N1 illustrated in FIG. 2A, and the second bridge electrode BE2 may correspond to the second node N2 illustrated in FIG. 2A.

First and second connecting electrodes CE1 and CE2 are additionally located on the fourth insulating layer 40. The first connecting electrode CNE1 is an electrode for connecting the third capacitor electrode CE3 to the first drive voltage line VL1. The second connecting electrode CNE2 is an electrode for connecting the first electrode S2 of the second transistor T2 to a data line (that is, the i-th data line DLi).

The first connecting electrode CE1 is connected with the third capacitor electrode CE3 through a contact hole penetrating the fourth insulating layer 40, and the second connecting electrode CE2 is connected with the first electrode S2 of the second transistor T2 through a contact hole penetrating the first to fourth insulating layers 10, 20, 30, and 40.

Figure 5A:
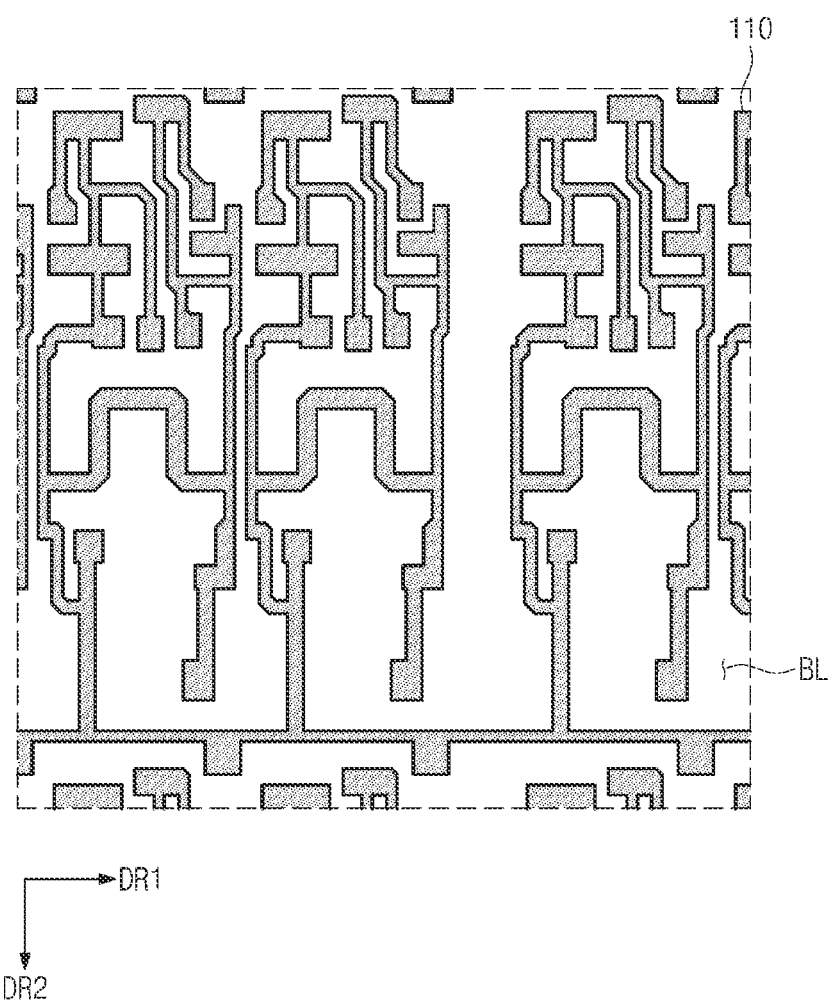
FIGS. 5A to 5G are plan views illustrating layouts of layers stacked in the display panel according to some embodiments of the present disclosure.
Figure 5B:
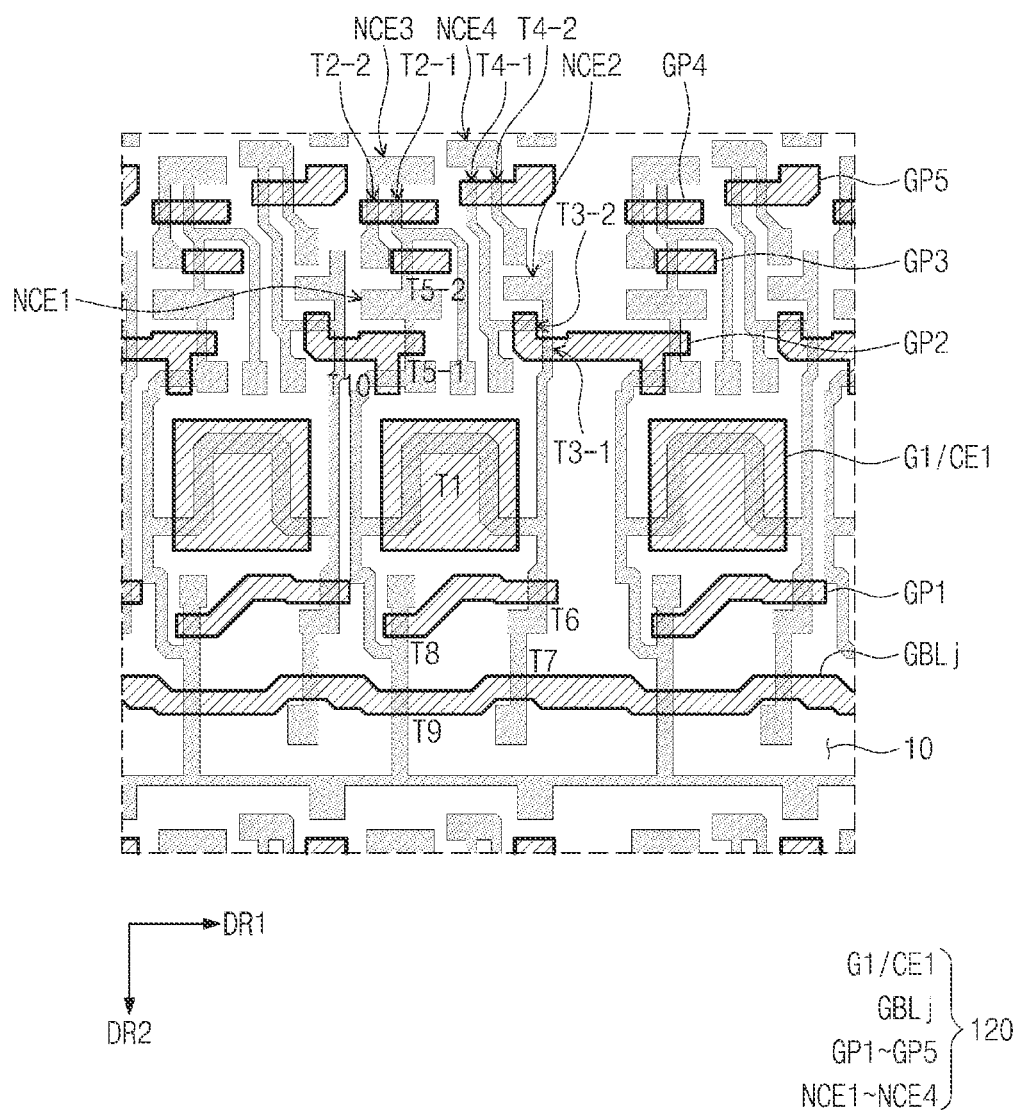
Figure 5C:
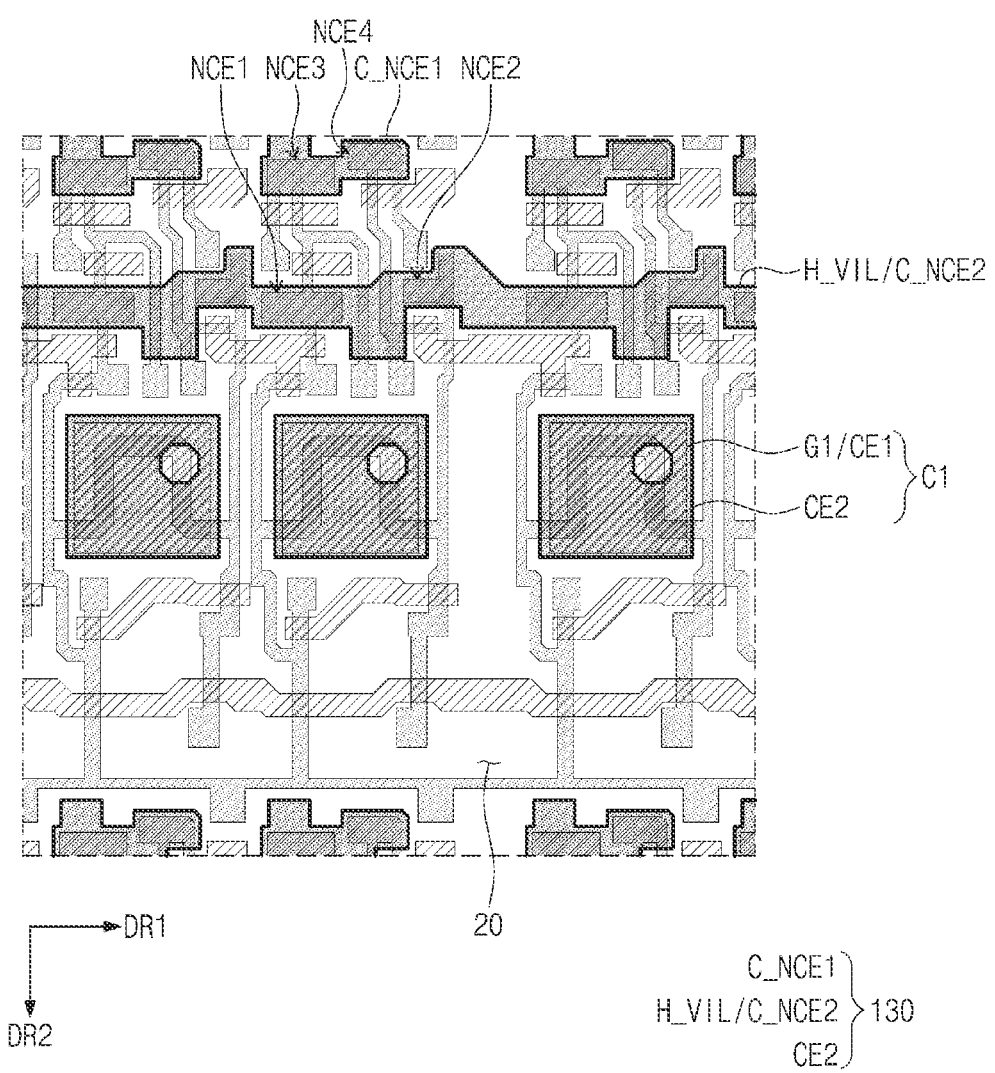
Figure 5D:
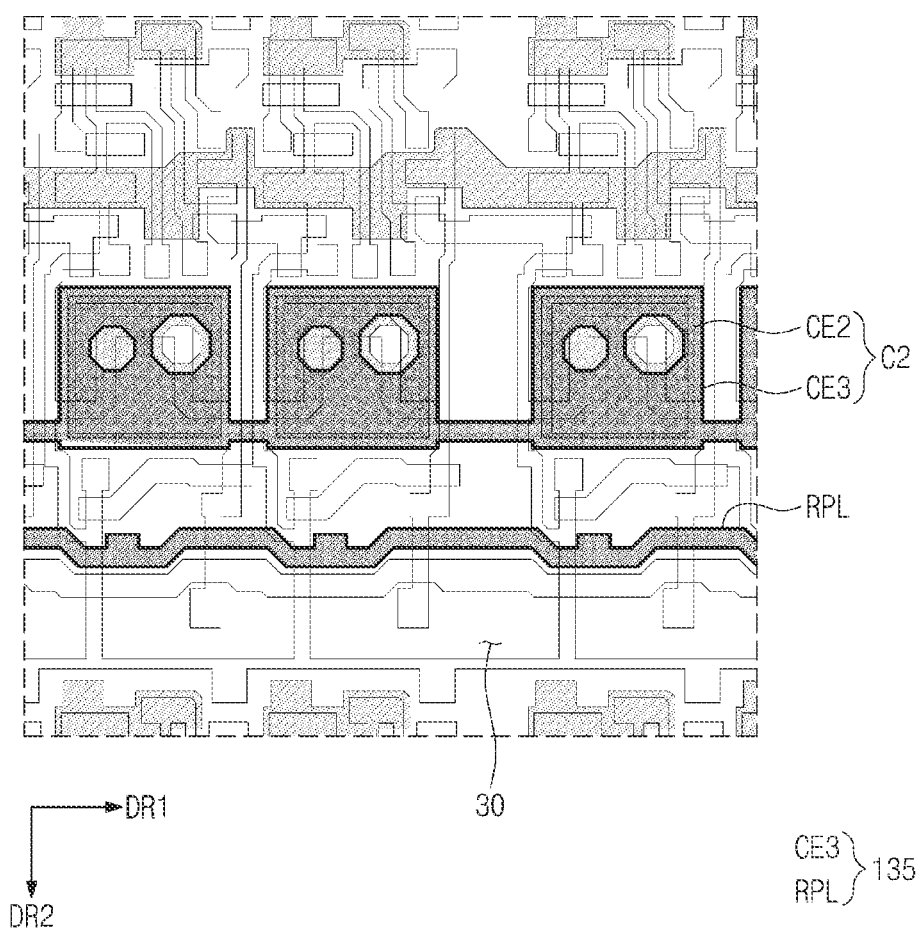
Figure 5E:
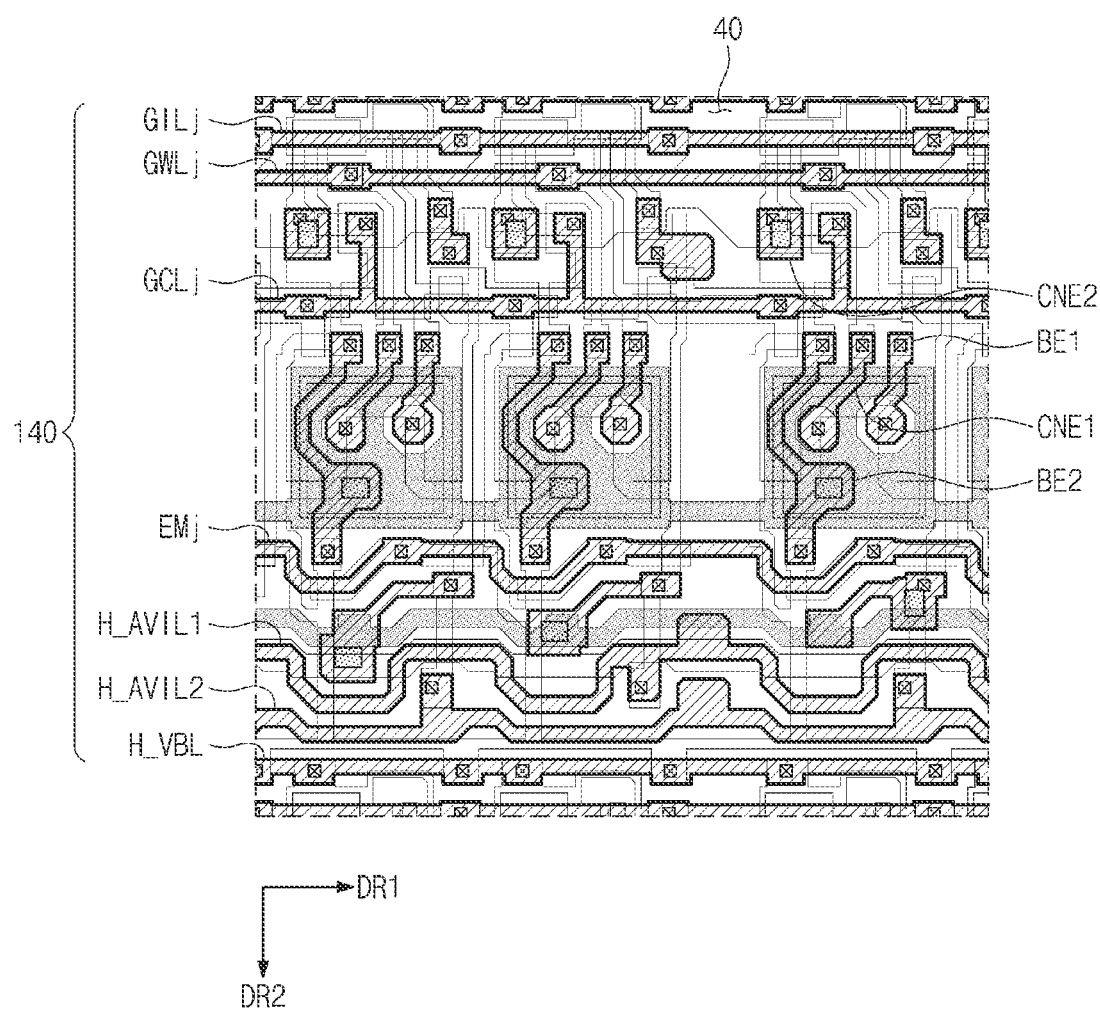

The first and second bridge electrodes BE1 and BE2 and the first and second connecting electrodes CE1 and CE2 may be portions of a first data pattern layer 140 illustrated in FIG. 5E.

A fifth insulating layer 50 is arranged to cover the first and second bridge electrodes BE1 and BE2 and the first and second connecting electrodes CE1 and CE2. The first drive voltage line VL1 and the data lines DLi−1, DLi and DLi+1 may be located on the fifth insulating layer 50.

The first drive voltage line VL1 is connected with the first connecting electrode CE1 through a contact hole formed through the fifth insulating layer 50, and the data lines DLi−1, DLi and DLi+1 is connected with the second connecting electrode CE2 through a contact hole formed through the fifth insulating layer 50.

An element connecting electrode P_CNE to be connected with the light emitting element ED may be additionally located on the fifth insulating layer 50. The element connecting electrode P_CNE may be connected with the anode AE of the light emitting element ED. The first drive voltage line VL1, the data lines DLi−1, DLi and DLi+1, and the element connecting electrode P_CNE may be portions of a second data pattern layer 150 illustrated in FIG. 5F.

A sixth insulating layer 60 that covers the first drive voltage line VL1 and the data line DLi−1, DLi and DLi+1 is located on the fifth insulating layer 50. According to some embodiments, the sixth insulating layer 60 may include a silicon oxide layer and a silicon nitride layer. The sixth insulating layer 60 may include a plurality of silicon oxide layers and a plurality of silicon nitride layers alternately stacked one above another.

The element layer DP_ED is located on the circuit layer DP_CL. The element layer DP_ED may include the light emitting element ED and a pixel defining layer PDL. The light emitting element ED includes the anode AE, an emissive layer EL, and a cathode CCE.

The pixel defining layer PDL may include an opening OP defined therein to correspond to the light emitting element ED. The opening OP exposes at least a portion of the anode AE of the light emitting element ED. The opening OP of the pixel defining layer PDL may define an emissive region PXA. For example, the plurality of pixels PX (refer to FIG. 1) may be located on the plane of the display panel DP (refer to FIG. 1) according to a rule (e.g., a set or predetermined rule). Regions where the plurality of pixels PX are located may be defined as pixel regions, and one pixel region may include an emissive region PXA and a non-emissive region NPXA adjacent to the emissive region PXA. The non-emissive region NPXA may surround the emissive region PXA.

The emissive layer EL is arranged to correspond to the opening OP defined in the pixel defining layer PDL. Although the patterned emissive layer EL is illustrated, embodiments according to the present disclosure are not limited thereto. A common emissive layer may be commonly arranged for the plurality of pixels PX. In this case, the common emissive layer may generate white light or blue light.

The cathode CCE is located on the emissive layer EL. The cathode CCE is commonly arranged for the plurality of pixels PX.

The display panel DP may further include an encapsulation layer that seals the element layer DP_ED. The encapsulation layer may include at least one organic layer and at least one inorganic layer. The inorganic layer may include an inorganic material and may protect the element layer DP_ED from moisture/oxygen. The inorganic layer may include a silicon nitride layer, a silicon oxy-nitride layer, a silicon oxide layer, a titanium oxide layer, or an aluminum oxide layer, but is not particularly limited thereto. The organic layer may include an organic material and may protect the element layer DP_ED from foreign matter such as dust particles.

Figure 5F:
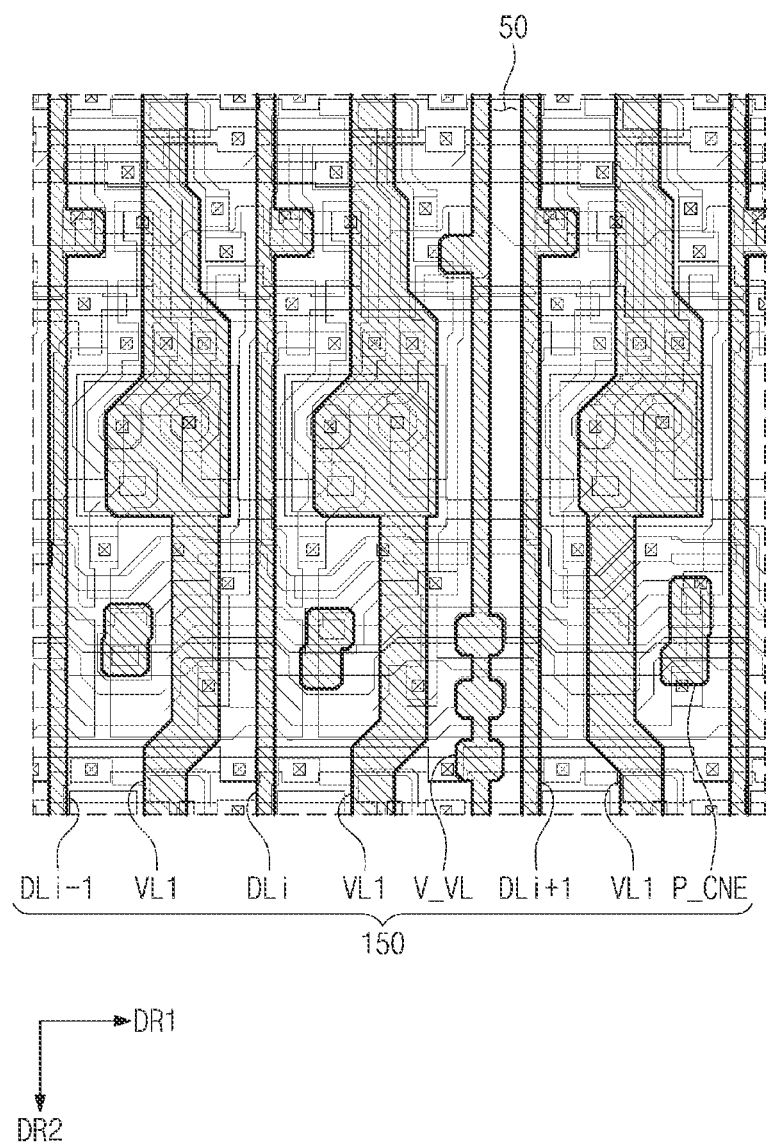
Figure 5G:
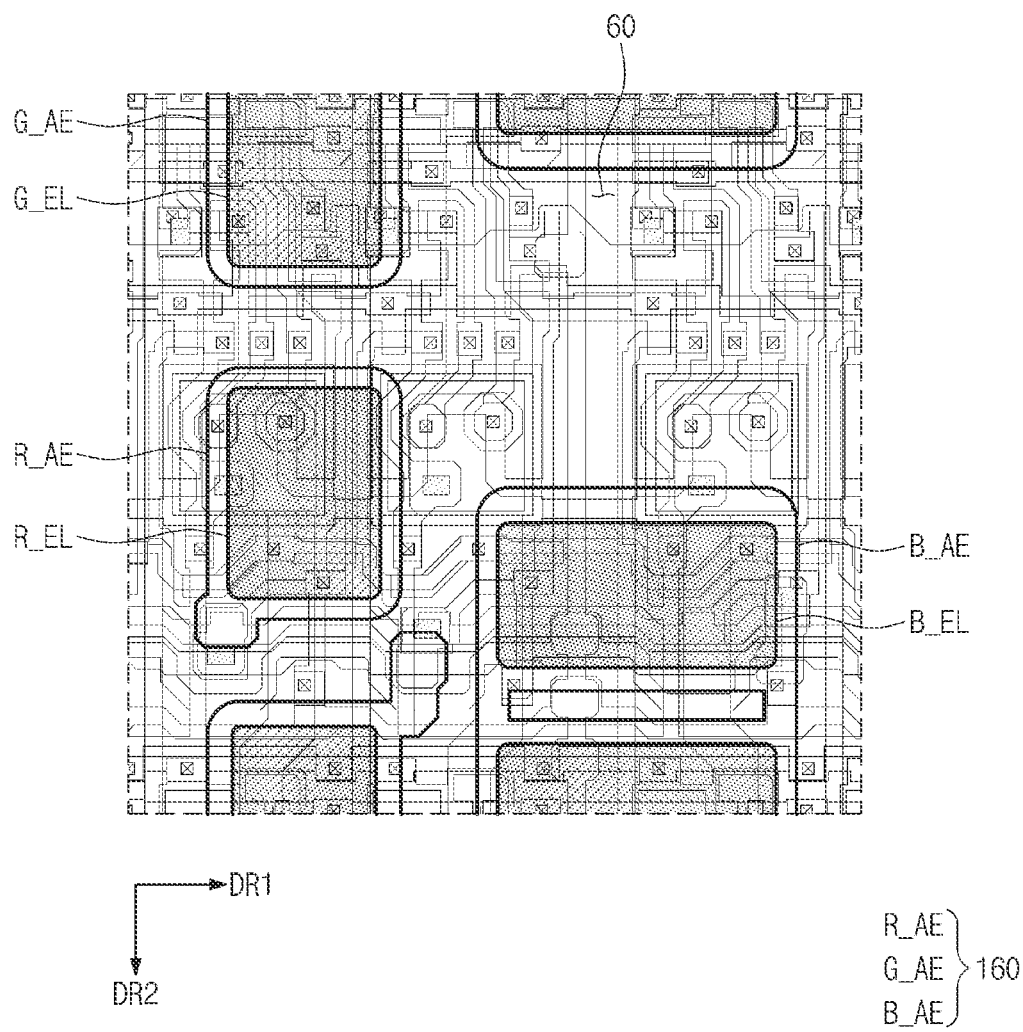

FIGS. 5A to 5G are plan views illustrating layouts of layers stacked in the display panel. For example, FIG. 5A is a plan view illustrating a semiconductor pattern layer located on the base layer, and FIG. 5B is a plan view illustrating the first gate pattern layer located on the base layer and the semiconductor pattern layer. FIG. 5C is a plan view illustrating the second gate pattern layer located on the first gate pattern layer, and FIG. 5D is a plan view illustrating the additional pattern layer located on the second gate pattern layer. FIG. 5E is a plan view illustrating the first data pattern layer located on the additional pattern layer, and FIG. 5F is a plan view illustrating the second data pattern layer located on the first data pattern layer. FIG. 5G is a plan view illustrating an anode electrode layer located on the second data pattern layer.

Referring to FIGS. 4 and 5A, semiconductor patterns and conductive patterns may be repeatedly arranged on the base layer BL according to a rule (e.g., a set or predetermined rule). Plan views of three pixel circuit units PXCa (refer to FIG. 2B) are illustrated in FIGS. 5A to 5G.

Referring to FIG. 5A, the semiconductor pattern layer 110 is illustrated. The semiconductor pattern layer 110 may be located on the base layer BL. The semiconductor pattern layer 110 may include a silicon semiconductor. For example, the silicon semiconductor may include amorphous silicon or polycrystalline silicon. For example, the semiconductor pattern layer 110 may include low-temperature polycrystalline silicon (LTPS).

The semiconductor pattern layer 110 includes semiconductor patterns of transistors (that is, the first to tenth transistors T1 to T10) included in each pixel circuit unit PXCa.

Referring to FIGS. 4 and 5B, the first insulating layer 10 may be located on the semiconductor pattern layer 110, and the first gate pattern layer 120 may be located on the first insulating layer 10. The first gate pattern layer 120 may be a layer formed by making a first gate metal layer subject to patterning. The first gate pattern layer 120 may include metal, alloy, conductive metal oxide, or a transparent conductive material. For example, the first gate pattern layer 120 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), or indium zinc oxide (IZO), but is not particularly limited thereto.

The first gate pattern layer 120 may include the third electrodes of the transistors (that is, the first to tenth transistors T1 to T10) included in each pixel circuit unit PXCa. The first to tenth transistors T1 to T10 may be formed in each pixel circuit unit PXCa by the first gate pattern layer 120 and the semiconductor pattern layer 110.

The semiconductor pattern layer 110 further includes the first node capacitor electrode NCE1, the second node capacitor electrode NCE2, the third node capacitor electrode NCE3, and the fourth node capacitor electrode NCE4. The first node capacitor electrode NCE1 extends from the fifth-first transistor T5-1 and the fifth-second transistor T5-2 and defines the first intermediate node CN1 illustrated in FIG. 2B. The second node capacitor electrode NCE2 extends from the third-first transistor T3-1 and the third-second transistor T3-2 and defines the second intermediate node CN2 illustrated in FIG. 2B. The third node capacitor electrode NCE3 extends from the second-first transistor T2-1 and the second-second T2-2 and defines the third intermediate node CN3 illustrated in FIG. 2B. The fourth node capacitor electrode NCE4 extends from the fourth-first transistor T4-1 and the fourth-second T4-2 and defines the fourth intermediate node CN4 illustrated in FIG. 2B.

The first to fourth node capacitor electrodes NCE1, NCE2, NCE3, and NCE4 are provided on the same layer (e.g., the base layer BL) as the semiconductor patterns of the first to tenth transistors T1 to T10.

The first gate pattern layer 120 further includes the first capacitor electrode CE1 and the j-th black scan line GBLj. The first capacitor electrode CE1 is an electrode for forming the first capacitor C1 included in each pixel circuit unit PXCa. The j-th black scan line GBLj may be connected to the third electrodes G7 and G9 of the seventh and ninth transistors T7 and T9 included in each pixel circuit unit PXCa.

Referring to FIGS. 4 and 5C, the second insulating layer 20 may be located on the first insulating layer 20 to cover the first gate pattern layer 120. The second gate pattern layer 130 may be located on the second insulating layer 20. The second gate pattern layer 130 may be a layer formed by making a second gate metal layer subject to patterning. The second gate pattern layer 130 may include metal, alloy, conductive metal oxide, or a transparent conductive material.

The second gate pattern layer 130 may include the second capacitor electrode CE2. The second capacitor electrode CE2 is arranged to overlap the first capacitor electrode CE1 on the plane. The first capacitor C1 may be formed in each pixel circuit unit PXCa by the first capacitor electrode CE1 and the second capacitor electrode CE2.

The second gate pattern layer 130 further includes a first common node capacitor electrode C_NCE1 and a second common node capacitor electrode C_NCE2. The first common node capacitor electrode C_NCE1 may commonly overlap the first and second node capacitor electrodes NCE1 and NCE2. The first common node capacitor electrode C_NCE1 faces the first node capacitor electrode NCE1 with the first insulating layer 10 therebetween to from the first node capacitor NC1 (refer to FIG. 2B) and faces the second node capacitor electrode NCE2 with the first insulating layer 10 therebetween to from the second node capacitor NC2 (refer to FIG. 2B). The second common node capacitor electrode C_NCE2 may commonly overlap the third and fourth node capacitor electrodes NCE3 and NCE4. The second common node capacitor electrode C_NCE2 faces the third node capacitor electrode NCE3 with the first and second insulating layers 10 and 20 therebetween to from the third node capacitor NC3 (refer to FIG. 2B) and faces the fourth node capacitor electrode NCE4 with the first insulating layer 10 therebetween to from the fourth node capacitor NC4 (refer to FIG. 2B). According to some embodiments of the present disclosure, the first common node capacitor electrode C_NCE1 may have a floating state.

The second gate pattern layer 130 may further include a first horizontal initialization line H_VIL extending in the first direction DR1. The first horizontal initialization line H_VIL may be included in the first initialization voltage line VIL illustrated in FIGS. 2A and 2B. The first initialization voltage VINT may be applied to the first horizontal initialization line H_VIL. According to some embodiments of the present disclosure, the first horizontal initialization line H_VIL may be integrally formed with the second common node capacitor electrode C_NCE2. A portion of the first horizontal initialization line H_VIL may be used as the second common node capacitor electrode C_NCE2. Accordingly, one end of the first node capacitor NC1 and one end of the second node capacitor NC2 may be connected to the first horizontal initialization line H_VIL and may receive the first initialization voltage VINT.

Referring to FIGS. 4 and 5D, the third insulating layer 30 may be located on the second insulating layer 20 to cover the second gate pattern layer 130. The additional pattern layer 135 may be located on the third insulating layer 30. The additional pattern layer 135 may include metal, alloy, conductive metal oxide, or a transparent conductive material.

The additional pattern layer 135 may include the third capacitor electrode CE3. The third capacitor electrode CE3 is arranged to overlap the second capacitor electrode CE2 on the plane. The second capacitor C2 may be formed in each pixel circuit unit PXCa by the second capacitor electrode CE2 and the third capacitor electrode CE3. The first to third capacitor electrodes CE1 to CE3 may overlap the first transistor T1 on the plane. As the first transistor T1 and the first and second capacitors C1 and C2 that occupy the largest area in each pixel circuit unit PXCa are arranged to overlap each other on the plane, the capacitances of the first and second capacitors C1 and C2 may be secured to the maximum while the total area of each pixel circuit unit PXCa is decreased. Accordingly, more pixel circuit units PXCa may be formed in the display panel DP having a given size, and thus the resolution of the display panel DP may be improved.

The additional pattern layer 135 may further include a plurality of repair lines RPL extending in the first direction DR1. The plurality of repair lines RPL may be provided to repair the lines (e.g., the scan lines and the light emission control lines) provided in the display panel DP (refer to FIG. 1). For example, when one of the scan lines and the light emission control lines is disconnected, two portions of the disconnected line may be connected with an adjacent corresponding repair line RPL. Accordingly, the two portions of the disconnected line may be electrically connected through the corresponding repair line RPL. According to some embodiments of the present disclosure, the corresponding repair line RPL and the disconnected line may be connected with each other in the non-display region NDA (refer to FIG. 1).

Referring to FIGS. 4 and 5E, the fourth insulating layer 40 may be located on the third insulating layer 30 to cover the additional pattern layer 135. The first data pattern layer 140 may be located on the fourth insulating layer 40. The first data pattern layer 140 may be a layer formed by making a first data metal layer subject to patterning. The first data pattern layer 140 may include metal, alloy, conductive metal oxide, or a transparent conductive material.

The first data pattern layer 140 may include the scan lines GWLj, GCLj, and GILj and the light emission control lines EMLj illustrated in FIG. 2B. The scan lines GWLj, GCLj, and GILj and the light emission control lines EMLj may extend in the first direction DR1 and may be spaced apart from each other in the second direction DR2.

The first data pattern layer 140 may further include a second-first horizontal initialization voltage line H_AVIL1, a second-second horizontal initialization voltage line H_AVIL2, and a horizontal bias voltage line H_VBL. The second-first horizontal initialization voltage line H_AVIL1, the second-second horizontal initialization voltage line H_AVIL2, and the horizontal bias voltage line H_VBL may extend in the first direction DR1 and may be spaced apart from each other in the second direction DR2.

The second-first horizontal initialization voltage line H_AVIL1 may be connected to at least one pixel (e.g., a second pixel) among the plurality of pixels PX illustrated in FIG. 1, and the second-second horizontal initialization voltage line H_AVIL2 may be connected to at least one pixel (e.g., first and third pixels) among the plurality of pixels PX. According to some embodiments of the present disclosure, the first pixel includes a first light emitting element that outputs first color light (e.g., red light), the second pixel includes a second light emitting element that outputs second color light (e.g., green light), and the third pixel includes a third light emitting element that outputs third color light (e.g., blue light).

The second-first horizontal initialization voltage line H_AVIL1 and the second-second horizontal initialization voltage line H_AVIL2 may be referred to as the second horizontal initialization voltage lines and may be included in the second initialization voltage line AVIL illustrated in FIGS. 2A and 2B. An second-first initialization voltage is applied to the second-first horizontal initialization voltage line H_AVIL1 as the second initialization voltage AINT, and an second-second initialization voltage is applied to the second-second horizontal initialization voltage line H_AVIL2 as the second initialization voltage AINT. The second-first initialization voltage may have a voltage level that is the same as, or different from, that of the second-second initialization voltage. Alternatively, the second initialization voltage line AVIL may include one second horizontal initialization voltage line. In this case, the second horizontal initialization voltage line may be commonly connected to the first to third pixels.

The horizontal bias voltage line H_VBL may be included in the bias voltage line VBL illustrated in FIGS. 2A and 2B. The bias voltage Vbias (refer to FIG. 2A) may be applied to the horizontal bias voltage line H_VBL.

The first data pattern layer 140 may further include the first and second bridge electrodes BE1 and BE2 and the first and second connecting electrodes CE1 and CE2 illustrated in FIG. 4.

The first bridge electrode BE1 may be an electrode that connects the third electrode G1 of the first transistor T1 (or, the first capacitor electrode CE1) and the second electrode D3 of the third transistor T3. The first bridge electrode BE1 is connected with the third electrode G1 of the first transistor T1 (or, the first capacitor electrode CE1) through the contact hole penetrating the second to fourth insulating layers 20, 30, and 40. Furthermore, the first bridge electrode BE1 is connected with the second electrode D3 of the third transistor T3 through the contact hole penetrating the first to fourth insulating layers 10, 20, 30, and 40.

The second bridge electrode BE2 may be an electrode that connects the second capacitor electrode CE2 and the second electrode D2 of the second transistor T2. The second bridge electrode BE2 is connected with the second capacitor electrode CE2 through the contact hole penetrating the third and fourth insulating layers 30 and 40 and is connected with the second electrode D2 of the second transistor T2 through the contact hole penetrating the first to fourth insulating layers 10, 20, 30, and 40.

Referring to FIGS. 4, 5E, and 5F, the fifth insulating layer 50 may be located on the fourth insulating layer 40 to cover the first data pattern layer 140. The second data pattern layer 150 may be located on the fifth insulating layer 50. The second data pattern layer 150 may be a layer formed by making a second data metal layer subject to patterning. The second data pattern layer 150 may include, for example, metal, alloy, conductive metal oxide, or a transparent conductive material.

The second data pattern layer 150 may include the data lines DLi−1, DLi, and DLi+1, the first drive voltage line VL1, and vertical voltage lines V_VL. The data lines DLi−1, DLi, and DLi+1, the first drive voltage line VL1, and the vertical voltage lines V_VL may extend in the second direction DR2 and may be spaced apart from each other in the first direction DR1. The first drive voltage line VL1 may include a portion overlapping the third capacitor electrode CE3 on the plane. Each of the vertical voltage lines V_VL may be located between the data line DLi+1 and the first drive voltage line VL1 on the plane.

One of the vertical voltage lines V_VL may be electrically connected with the first horizontal initialization voltage line H_VIL, the second-first horizontal initialization voltage line H_AVIL1, the second-second horizontal initialization voltage line H_AVIL2, and the horizontal bias voltage line H_VBL and may be used as at least one of the first initialization voltage line VIL (refer to FIG. 2A), the second initialization voltage line AVIL (refer to FIG. 2A), or the bias voltage line VBL (refer to FIG. 2A). Accordingly, each of the first initialization voltage line VIL, the second initialization voltage line AVIL, and the bias voltage line VBL may be provided in a mesh shape on the display panel DP. One of the vertical voltage lines V_VL may be used as the second drive voltage line VL2 (refer to FIG. 2A). The vertical voltage lines V_VL will be described below in detail with reference to FIGS. 6 and 7.

The second data pattern layer 150 may further include the element connecting electrode P_CNE. The element connecting electrode P_CNE may be provided in an island shape in each pixel PX and may be connected to the anode AE of the light emitting element ED included in each pixel.

Referring to FIGS. 4, 5F, and 5G, the sixth insulating layer 60 may be located on the fifth insulating layer 50 to cover the second data pattern layer 150. The anode electrode layer 160 may be located on the sixth insulating layer 60. The anode electrode layer 160 may include, for example, metal, alloy, conductive metal oxide, or a transparent conductive material.

The anode electrode layer 160 may include a first anode R_AE of the first light emitting element, a second anode G_AE of the second light emitting element, and a third anode B_AE of the third light emitting element. The first light emitting element outputs the first color light (e.g., red light), the second light emitting element outputs the second color light (e.g., green light), and the third light emitting element outputs the third color light (e.g., blue light). The light emitting element ED illustrated in FIG. 2B may be one of the first to third light emitting elements. Each of the first to third anodes R_AE, G_AE, and B_AE may be arranged to overlap a corresponding element connecting electrode P_CNE on the plane. Each of the first to third anodes R_AE, G_AE, and B_AE may be connected to a corresponding pixel circuit unit PXCa (illustrated in FIG. 2B) through a contact hole that exposes the corresponding element connecting electrode P_CNE.

The first light emitting element further includes a first emissive layer R_EL located on the first anode R_AE, the second light emitting element further includes a second emissive layer G_EL located on the second anode G_AE, and the third light emitting element further includes a third emissive layer B_EL located on the third anode B_AE.

Figure 6:
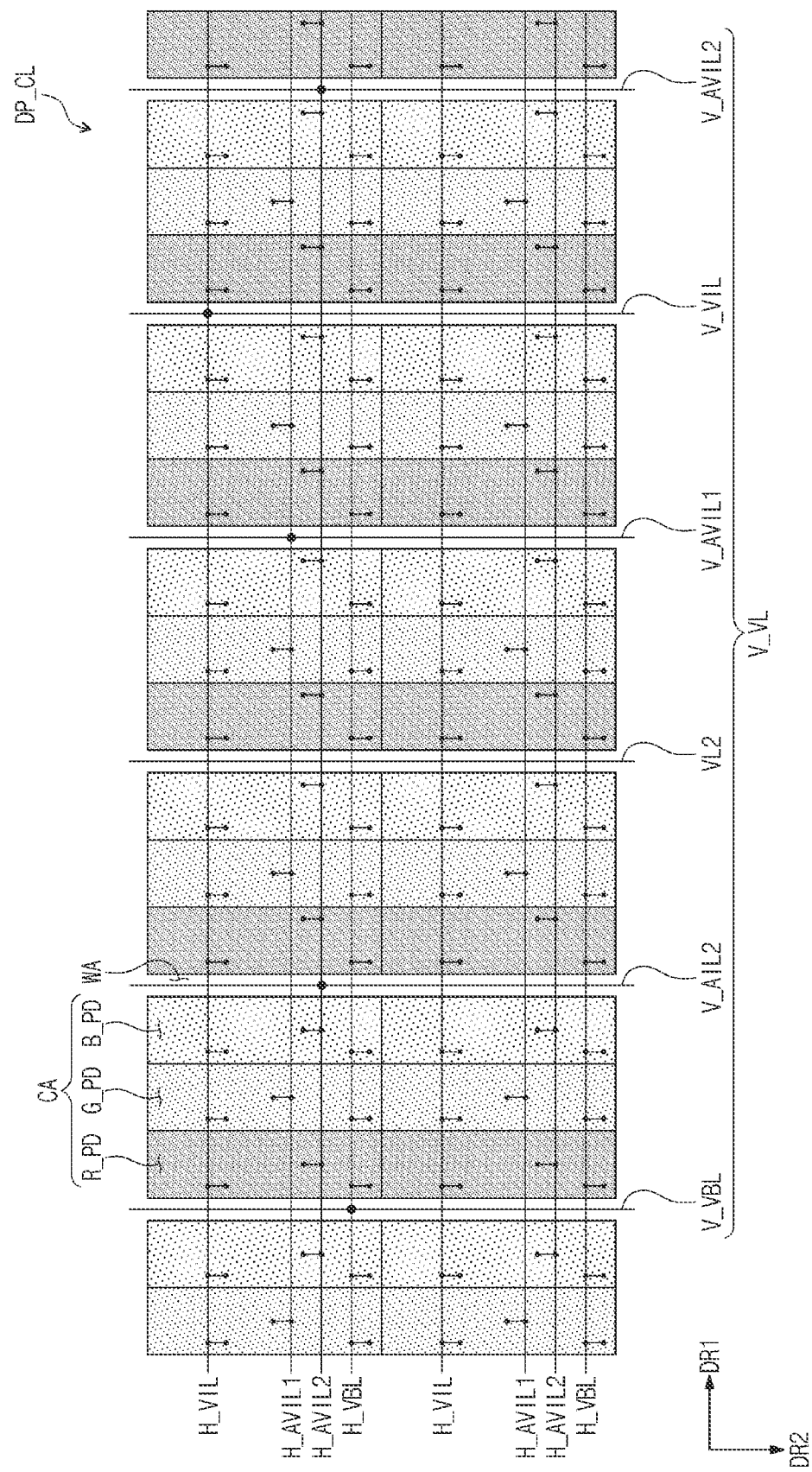
FIG. 6 is a plan view illustrating an arrangement of voltage lines and pixel circuits according to some embodiments of the present disclosure.
Figure 7:
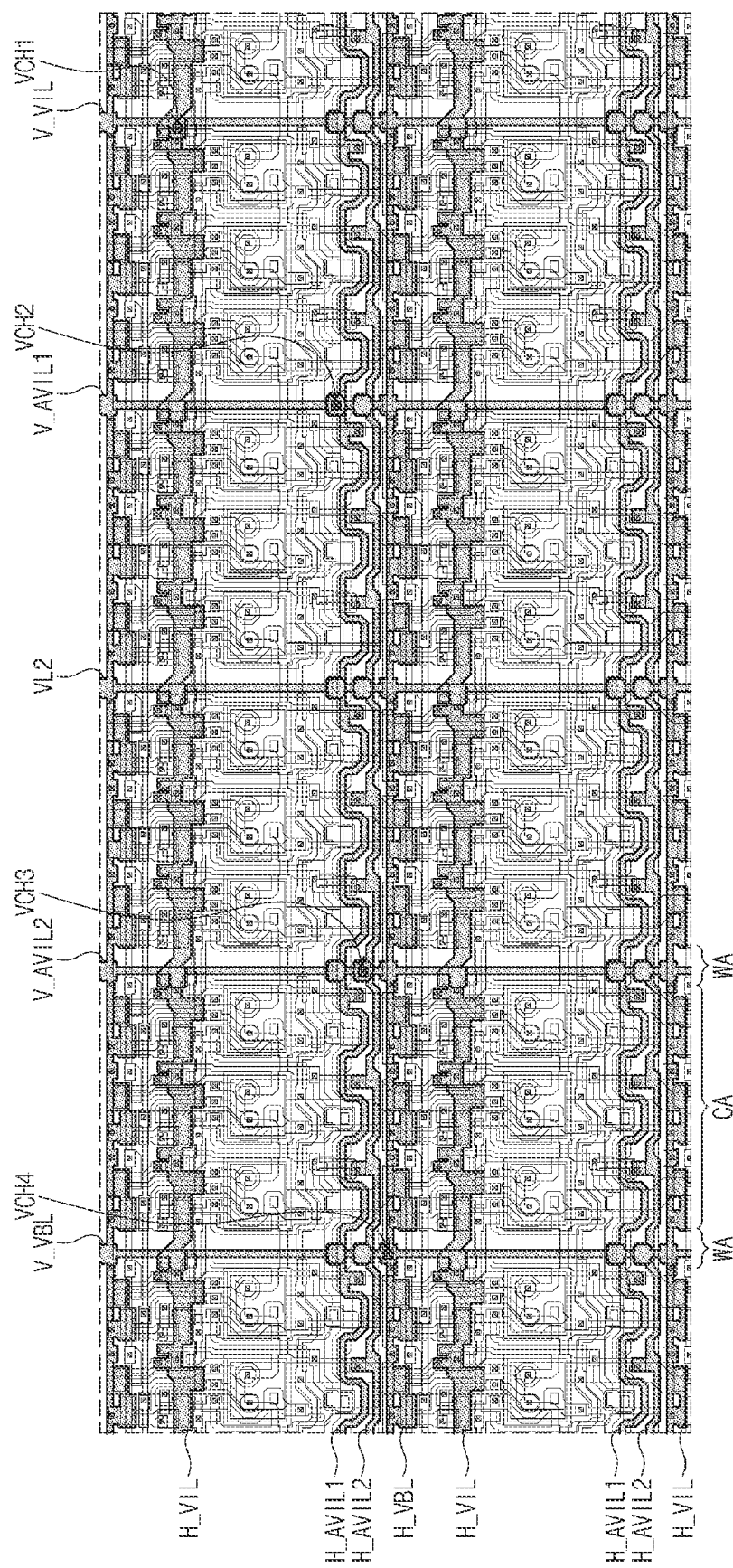
FIG. 7 is a plan view illustrating a layout of horizontal voltage lines and vertical voltage lines according to some embodiments of the present disclosure.

FIG. 6 is a plan view illustrating an arrangement of voltage lines and pixel circuit units according to some embodiments of the present disclosure, and FIG. 7 is a plan view illustrating a layout of the voltage lines according to some embodiments of the present disclosure.

Referring to FIGS. 6 and 7, the circuit layer DP_CL of the display panel DP (refer to FIG. 1) includes a plurality of circuit regions CA repeatedly arranged in the first direction DR1 and a plurality of wiring regions WA defined on first sides of the plurality of circuit regions CA, respectively. At least one pixel circuit unit may be located in each of the plurality of circuit regions CA. According to some embodiments of the present disclosure, three pixel circuit units (hereinafter, the first to third pixel circuit units R_PD, G_PD, and B_PD) sequentially arranged in the first direction DR1 may be located in each circuit region CA. The first pixel circuit unit R_PD is included in the first pixel that outputs the first color light, the second pixel circuit unit G_PD is included in the second pixel that outputs the second color light, and the third pixel circuit unit B_PD is included in the third pixel that outputs the third color light.

Each of the first to third pixel circuit units R_PD, G_PD, and B_PD may cross horizontal voltage lines extending in the first direction DR1. According to some embodiments of the present disclosure, the horizontal voltage lines may include the first horizontal initialization line H_VIL, the second-first horizontal initialization voltage line H_AVIL1, the second-second horizontal initialization voltage line H_AVIL2, and the horizontal bias voltage line H_VBL.

The first horizontal initialization line H_VIL and the horizontal bias voltage line H_VBL are connected to the first to third pixel circuit units R_PD, G_PD, and B_PD. The second-first horizontal initialization voltage line H_AVIL1 is connected to the second pixel circuit unit G_PD among the first to third pixel circuit units R_PD, G_PD, and B_PD, and the second-second horizontal initialization voltage line H_AVIL2 is connected to the first and third pixel circuit units R_PD and B_PD among the first to third pixel circuit units R_PD, G_PD, and B_PD.

The plurality of vertical voltage lines V_VL extending in the second direction DR2 crossing the first direction DR1 are located in the plurality of wiring regions WA. One of the vertical voltage lines V_VL may be electrically connected with the first horizontal initialization voltage line H_VIL, the second-first horizontal initialization voltage line H_AVIL1, the second-second horizontal initialization voltage line H_AVIL2, and the horizontal bias voltage line H_VBL. According to some embodiments of the present disclosure, the vertical voltage lines V_VL may include a first vertical initialization voltage line V_VIL, a second-first vertical initialization voltage line V_AVIL1, a second-second vertical initialization voltage line V_AVIL2, and a vertical bias voltage line V_VBL. The first vertical initialization voltage line V_VIL is connected to the first horizontal initialization voltage line H_VIL at a first contact portion VCH1, and the second-first vertical initialization voltage line V-AVIL1 is connected with the second-first horizontal initialization voltage line H_AVIL1 at a second contact portion VCH2. The second-second vertical initialization voltage line V_AVIL2 is connected with the second-second horizontal initialization voltage line H_AVIL2 at a third contact portion VCH3, and the vertical bias voltage line V_VBL is connected with the horizontal bias voltage line H_VBL at a fourth contact portion VCH4. The first to fourth contact portions VCH1, VCH2, VCH3, and VCH4 may be located in the wiring regions WA.

Accordingly, the first initialization voltage line VIL may be provided in a mesh shape by the first vertical initialization voltage line V_VIL and the first horizontal initialization voltage line H_VIL, and a second-first initialization voltage line AVIL1 may be provided in a mesh shape by the second-first vertical initialization voltage line V_AVIL1 and the second-first horizontal initialization voltage line H_AVIL1. A second-second initialization voltage line AVIL2 may be provided in a mesh shape by the second-second vertical initialization voltage line V_AVIL2 and the second-second horizontal initialization voltage line H_AVIL2. The bias voltage line VBL may be provided in a mesh shape by the vertical bias voltage line V_VBL and the horizontal bias voltage line H_VBL.

One of the vertical voltage lines V_VL (hereinafter, referred to as the vertical drive voltage line V_VL2) may be used as the second drive voltage line VL2 (refer to FIG. 2A). The vertical drive voltage line V_VL2 may be connected with an outer voltage line in the non-display region NDA (refer to FIG. 1). Alternatively, when the second drive voltage line VL2 further includes a horizontal drive voltage line, the vertical drive voltage line V_VL2 may be connected with the horizontal drive voltage line in the wiring region WA.

According to some embodiments of the present disclosure, the vertical bias voltage line V_VBL, the second-second vertical initialization voltage line V_AVIL2, the vertical drive voltage line V_VL2, the second-first vertical initialization voltage line V_AVIL1, and the vertical initialization voltage line V_VIL may be sequentially arranged in the first direction DR1. However, the order in which the voltage lines are arranged is not particularly limited. Alternatively, an arrangement may be made in the order of the vertical bias voltage line V_VBL, the second-second vertical initialization voltage line V_AVIL2, the vertical drive voltage line V_VL2, the second-first vertical initialization voltage line V_AVIL1, the vertical initialization voltage line V_VIL, and the second-second vertical initialization voltage line V_AVIL2. In this case, in the display panel DP, the number of second-second vertical initialization voltage lines V_AVIL2 may be greater than the number of second-first vertical initialization voltage lines V_AVIL1.

As the voltage lines VIL, AVIL, and VBL connected to the pixel circuit units R_PD, G_PD, and B_PD are provided in a mesh shape on the display panel DP as described above, a luminance difference between the pixels caused by a drop in voltages applied to the voltage lines VIL, AVIL, and VBL may be reduced, and thus the overall picture quality of the display panel DP may be improved.

According to the present disclosure, the circuit structure capable of sufficiently securing the compensation time of the first transistor in the display device operating in the variable frequency mode may be provided. Furthermore, even though each pixel circuit unit includes ten transistors and two capacitors according to some embodiments, the resolution of the display panel may be relatively improved by efficiently reducing the area occupied by each pixel circuit unit.

In addition, the voltage lines connected to each pixel circuit unit may be provided in a mesh shape on the display panel. Accordingly, a luminance difference between the pixels caused by a drop in voltages applied to the voltage lines may be reduced, and thus the picture quality of the display panel may be improved.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:
1. A display panel comprising:
an element layer including a light emitting element; and
a circuit layer including a pixel circuit connected to the light emitting element,
wherein the circuit layer includes:

a first transistor connected between a first drive voltage line and the light emitting element and configured to operate according to a potential of a first node;
a second transistor connected between a data line and a second node;
a third transistor connected between the first transistor and the first node;
a first capacitor electrode connected to the first node;
a second capacitor electrode connected to the second node and facing the first capacitor electrode to form a first capacitor;
a third capacitor electrode facing the second capacitor electrode to form a second capacitor and connected to the first drive voltage line;
a first bridge electrode electrically connecting the first capacitor electrode and the third transistor; and
a second bridge electrode electrically connecting the second capacitor electrode and the second transistor.

2. The display panel of claim 1, wherein the first capacitor electrode is on a first insulating layer,
wherein the second capacitor electrode is on a second insulating layer covering the first capacitor electrode,
wherein the third capacitor electrode is on a third insulating layer covering the second capacitor electrode, and
wherein the first and second bridge electrodes are on a fourth insulating layer covering the third capacitor electrode.

3. The display panel of claim 2, wherein in a plan view, the first to third capacitor electrodes overlap the first transistor, and
wherein in a cross-sectional view, the first capacitor is located between the second capacitor and the first transistor.

4. The display panel of claim 2, wherein the circuit layer further includes a connecting electrode configured to connect the third capacitor electrode and the first drive voltage line.

5. The display panel of claim 4, wherein the connecting electrode is on the fourth insulating layer, and
wherein the first drive voltage line is on a fifth insulating layer configured to cover the connecting electrode and the first and second bride electrodes.

6. The display panel of claim 1, wherein the circuit layer further includes:
a fourth transistor connected between the first node and a first initialization voltage line and configured to operate in response to a first scan signal; and
a fifth transistor connected between the second node and the first drive voltage line and configured to operate in response to a second scan signal.

7. The display panel of claim 6, wherein the third transistor is configured to operate in response to the second scan signal, and
wherein an active period of the first scan signal does not overlap an active period of the second scan signal.

8. The display panel of claim 6, wherein the fifth transistor includes:
a fifth-first transistor connected between the first drive voltage line and a first intermediate node; and
a fifth-second transistor connected between the first intermediate node and the second node, and
wherein the third transistor includes:
a third-first transistor connected between an output electrode of the first transistor and a second intermediate node; and a third-second transistor connected between the second intermediate node and the first node.

9. The display panel of claim 8, wherein the circuit layer further includes:
a first node capacitor electrode configured to extend from the first intermediate node;
a second node capacitor electrode configured to extend from the second intermediate node; and
a first common node capacitor electrode configured to face the first node capacitor electrode to form a first node capacitor and configured to face the second node capacitor electrode to form a second node capacitor.

10. The display panel of claim 9, wherein the first and second node capacitor electrodes are on a same layer as the first capacitor electrode, and
wherein the first common node capacitor electrode is on the same layer as the second capacitor electrode.

11. The display panel of claim 6, wherein the second transistor includes:
a second-first transistor connected between the data line and a third intermediate node; and
a second-second transistor connected between the third intermediate node and the second node, and
wherein the fourth transistor includes:
a fourth-first transistor connected between the first node and a fourth intermediate node; and
a fourth-second transistor connected between the fourth intermediate node and the first initialization voltage line.

12. The display panel of claim 11, wherein the circuit layer further includes:
a third node capacitor electrode configured to extend from the third intermediate node;
a fourth node capacitor electrode configured to extend from the fourth intermediate node; and
a second common node capacitor electrode configured to face the third node capacitor electrode to form a third node capacitor and configured to face the fourth node capacitor electrode to form a fourth node capacitor.

13. The display panel of claim 12, wherein the third and fourth node capacitor electrodes are on a same layer as the first capacitor electrode, and
wherein the second common node capacitor electrode is on a same layer as the second capacitor electrode.

14. The display panel of claim 6, wherein the circuit layer further includes:
a sixth transistor connected between an output electrode of the first transistor and an anode of the light emitting element;
a seventh transistor connected between the anode and a second initialization voltage line;
an eighth transistor connected between the first drive voltage line and an input electrode of the first transistor;
a ninth transistor connected between the input electrode of the first transistor and a bias voltage line; and
a tenth transistor connected between the first drive voltage line and the input electrode of the first transistor.

15. The display panel of claim 14, wherein a control electrode of the tenth transistor is connected to a control electrode of the fifth transistor and is configured to receive the second scan signal.

16. The display panel of claim 15, wherein the circuit layer includes a plurality of circuit regions repeatedly arranged in a first direction and a plurality of wiring regions defined on first sides of the plurality of circuit regions, respectively, and
wherein a plurality of vertical voltage lines configured to extend in a second direction crossing the first direction are in the plurality of wiring regions, respectively.

17. The display panel of claim 16, wherein the first initialization voltage line includes a first horizontal initialization voltage line extending in the first direction,
wherein the second initialization voltage line includes a second horizontal initialization voltage line extending in the first direction,
wherein the bias voltage line includes a horizontal bias voltage line extending in the first direction, and
wherein at least one of the plurality of vertical voltage lines is connected with one of the first horizontal initialization voltage line, the second horizontal initialization voltage line, and the horizontal bias voltage line.

18. The display panel of claim 17, wherein the first horizontal initialization voltage line, the second horizontal initialization voltage line, and the horizontal bias voltage line are on a same layer as the first and second bridge electrodes, and
wherein the plurality of vertical voltage lines are on a same layer as the data line and the first drive voltage line.

19. The display panel of claim 18, wherein the data line and the first drive voltage line extend in the second direction, and
wherein in a plan view, the plurality of vertical voltage lines are between the data line and the first drive voltage line.

20. The display panel of claim 16, wherein the circuit layer further includes a second drive voltage line connected to a cathode of the light emitting element, and
wherein at least one of the plurality of vertical voltage lines is connected to the second drive voltage line.

21. The display panel of claim 1, wherein the circuit layer further includes a repair line on a same layer as the third capacitor electrode.

* * * * *